(12) United States Patent
Yamazaki et al.

(10) Patent No.: US 9,666,458 B2
(45) Date of Patent: May 30, 2017

(54) HEAT TREATMENT APPARATUS AND HEAT TREATMENT METHOD

(75) Inventors: Shunpei Yamazaki, Tokyo (JP);
Hisashi Ohtani, Kanagawa (JP);
Yasuyuki Arai, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/174,924

(22) Filed: Jul. 1, 2011

(65) Prior Publication Data

US 2011/0262117 A1 Oct. 27, 2011

Related U.S. Application Data

(62) Division of application No. 11/511,929, filed on Aug. 29, 2006, now Pat. No. 7,974,524, which is a division of application No. 10/098,688, filed on Mar. 15, 2002, now Pat. No. 7,118,780.

(30) Foreign Application Priority Data

Mar. 16, 2001 (JP) ................................ 2001-075756
Mar. 23, 2001 (JP) ................................ 2001-084905

(51) Int. Cl.
*F27D 11/12* (2006.01)
*H01L 21/67* (2006.01)
*C30B 33/00* (2006.01)

(52) U.S. Cl.
CPC ........ *H01L 21/67109* (2013.01); *C30B 33/00* (2013.01)

(58) Field of Classification Search
USPC ....... 392/410, 411, 416, 418, 341, 388, 389, 392/391, 392, 393, 394, 395, 399, 400, 392/405, 407, 480, 483; 219/411, 390, 219/444.1; 165/108; 118/725, 724, 50.1; 432/253, 258
See application file for complete search history.

(56) References Cited

U.S. PATENT DOCUMENTS 3,621,812 A * 11/1971 Hissong et al. ............. 118/725
4,326,342 A * 4/1982 Schregenberger ............ 34/538
5,318,101 A * 6/1994 Kim .............................. 165/10
5,378,283 A * 1/1995 Ushikawa .................... 118/719
(Continued)

FOREIGN PATENT DOCUMENTS

EP 0 936 662 A2 8/1999
JP 63-46380 2/1988
(Continued)

*Primary Examiner* — David Angwin
*Assistant Examiner* — Amit K Singh
(74) *Attorney, Agent, or Firm* — Husch Blackwell LLP

(57) ABSTRACT

A unit for supplying a gas from the upstream side of a reaction chamber, a unit for heating the gas in the upstream side of the reaction chamber, a unit for holding a substrate to be processed in the downstream side of the reaction chamber, and a unit for circulating the gas from the downstream side of the reaction chamber to the upstream side are prepared. The amount of electric power used in heating the gas can be economized by circulating the gas used to heat the substrate to be processed. A portion of the circulating gas may be expelled, and can be utilized as a heat source in order to preheat a newly introduced gas.

8 Claims, 15 Drawing Sheets

(56) References Cited

U.S. PATENT DOCUMENTS

| | | | |
|---|---|---|---|
| 5,551,984 A * | 9/1996 | Tanahashi | C23C 16/4401 118/715 |
| 5,562,383 A * | 10/1996 | Iwai et al. | 414/217.1 |
| 5,587,330 A | 12/1996 | Yamazaki | |
| 5,628,859 A * | 5/1997 | Janin et al. | 156/273.3 |
| 5,810,934 A | 9/1998 | Lord et al. | |
| 5,871,587 A * | 2/1999 | Hasegawa et al. | 118/719 |
| 5,871,806 A * | 2/1999 | Shoga et al. | 427/8 |
| 5,893,730 A | 4/1999 | Yamazaki et al. | |
| 5,997,286 A * | 12/1999 | Hemsath | C21D 1/74 432/143 |
| 6,013,544 A | 1/2000 | Makita et al. | |
| 6,015,593 A | 1/2000 | Yonkoski et al. | |
| 6,059,567 A | 5/2000 | Bolton et al. | |
| 6,133,073 A | 10/2000 | Yamazaki et al. | |
| 6,140,667 A | 10/2000 | Yamazaki et al. | |
| 6,187,379 B1 | 2/2001 | Lackey | |
| 6,195,504 B1 * | 2/2001 | Horie | C23C 16/448 392/394 |
| 6,204,194 B1 | 3/2001 | Takagi | |
| 6,291,275 B1 | 9/2001 | Yamazaki et al. | |
| 6,301,435 B1 * | 10/2001 | Ito et al. | 392/418 |
| 6,310,327 B1 | 10/2001 | Moore et al. | |
| 6,337,259 B1 | 1/2002 | Ueda et al. | |
| 6,348,368 B1 | 2/2002 | Yamazaki et al. | |
| 6,350,703 B1 | 2/2002 | Sakaguchi et al. | |
| 6,359,263 B2 * | 3/2002 | Tay et al. | 219/411 |
| 6,399,454 B1 | 6/2002 | Yamazaki | |
| 6,400,896 B1 * | 6/2002 | Longardner | 392/341 |
| 6,407,367 B1 * | 6/2002 | Ito et al. | 219/390 |
| 6,427,462 B1 | 8/2002 | Suenaga et al. | |
| 6,436,745 B1 | 8/2002 | Gotou et al. | |
| 6,458,637 B1 | 10/2002 | Yamazaki et al. | |
| 6,474,986 B2 | 11/2002 | Oda et al. | |
| 6,496,648 B1 * | 12/2002 | Mack | H01L 21/67115 118/50.1 |
| 6,512,206 B1 | 1/2003 | McEntire et al. | |
| 6,605,497 B2 | 8/2003 | Yamazaki et al. | |
| 6,616,898 B2 * | 9/2003 | Hara et al. | 422/112 |
| 6,825,072 B2 | 11/2004 | Yamazaki et al. | |
| 6,890,805 B2 | 5/2005 | Yamazaki et al. | |
| 6,962,837 B2 | 11/2005 | Yamazaki | |
| 7,118,780 B2 | 10/2006 | Yamazaki et al. | |
| 7,129,120 B2 | 10/2006 | Yamazaki | |
| 7,166,500 B2 | 1/2007 | Yamazaki et al. | |
| 2001/0051232 A1 | 12/2001 | Sakai et al. | |
| 2002/0000242 A1 | 1/2002 | Matushiita et al. | |
| 2002/0034863 A1 | 3/2002 | Yamazaki et al. | |
| 2002/0040981 A1 | 4/2002 | Yamazaki et al. | |
| 2002/0090765 A1 | 7/2002 | Yamazaki et al. | |
| 2002/0134530 A1 | 9/2002 | Giacobbe | |
| 2002/0179283 A1 | 12/2002 | Suenaga et al. | |
| 2002/0197785 A1 | 12/2002 | Yamazaki et al. | |
| 2003/0168004 A1 | 9/2003 | Nakata et al. | |
| 2003/0211669 A1 | 11/2003 | Yamazaki et al. | |
| 2005/0095760 A1 | 5/2005 | Yamazaki et al. | |
| 2005/0189592 A1 | 9/2005 | Yamazaki et al. | |
| 2008/0311286 A1 | 12/2008 | Yamazaki | |
| 2009/0098742 A1 * | 4/2009 | Timans | 438/795 |

FOREIGN PATENT DOCUMENTS

| | | |
|---|---|---|
| JP | 63-46380 A | 2/1988 |
| JP | 63-197343 A | 8/1988 |
| JP | 3-76227 A | 4/1991 |
| JP | 3-102818 A | 4/1991 |
| JP | 4-44314 A | 2/1992 |
| JP | 4-337628 A | 11/1992 |
| JP | 5-206044 A | 8/1993 |
| JP | 5-299364 A | 11/1993 |
| JP | 6-151414 A | 5/1994 |
| JP | 10-55951 A | 2/1998 |
| JP | 10-229078 A | 8/1998 |
| JP | 11-204535 A | 7/1999 |
| JP | 11-260728 A | 9/1999 |
| JP | 2000-105081 A | 4/2000 |
| JP | 2000-133606 A | 5/2000 |
| JP | 2000-223416 A | 8/2000 |
| JP | 2001-267264 A | 9/2001 |
| JP | 2002-289518 A | 10/2002 |
| KR | 1999-0016246 A | 3/1999 |
| KR | 1999-0053882 A | 7/1999 |
| KR | 2002-0091313 A | 12/2002 |

* cited by examiner

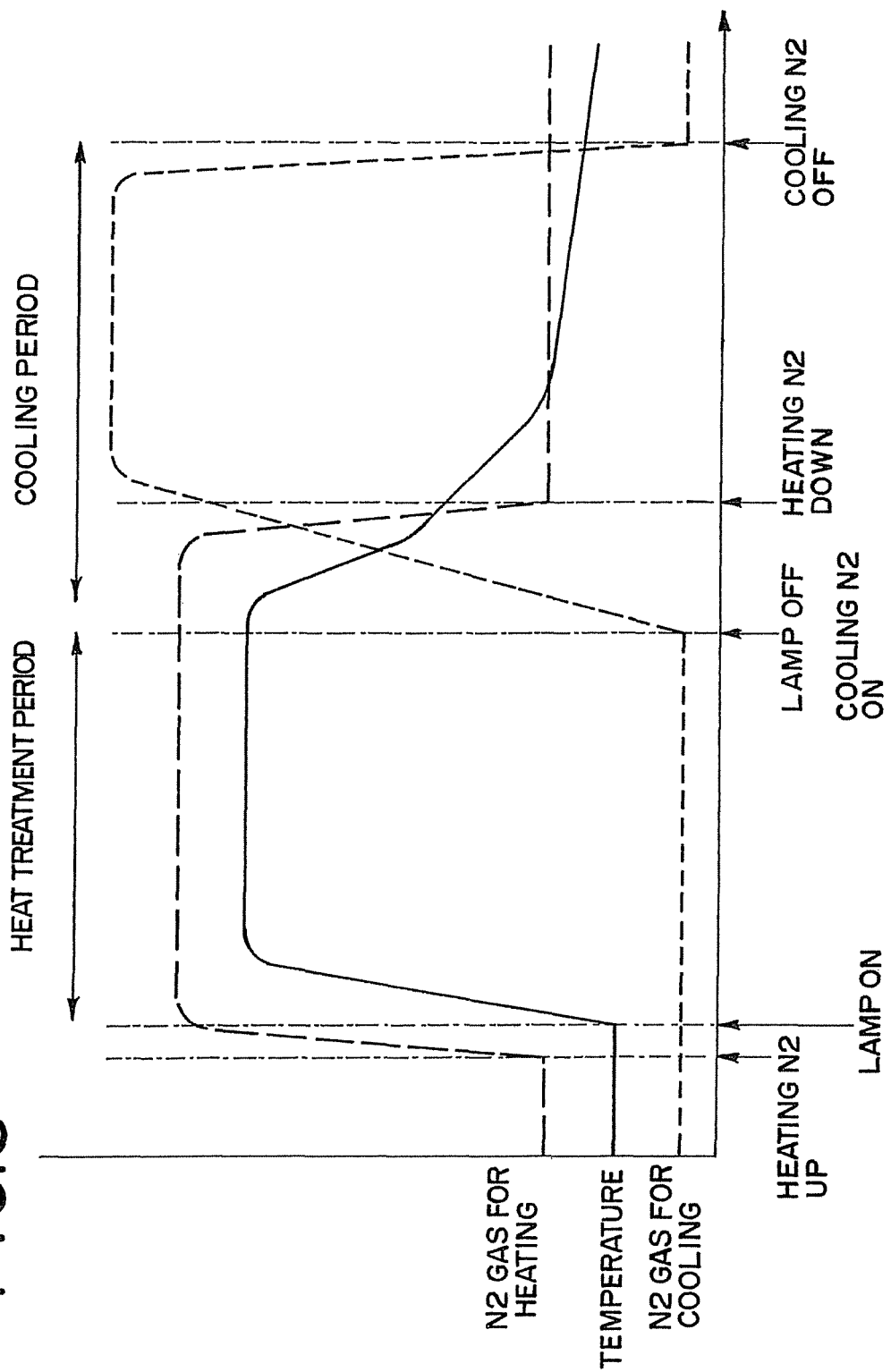

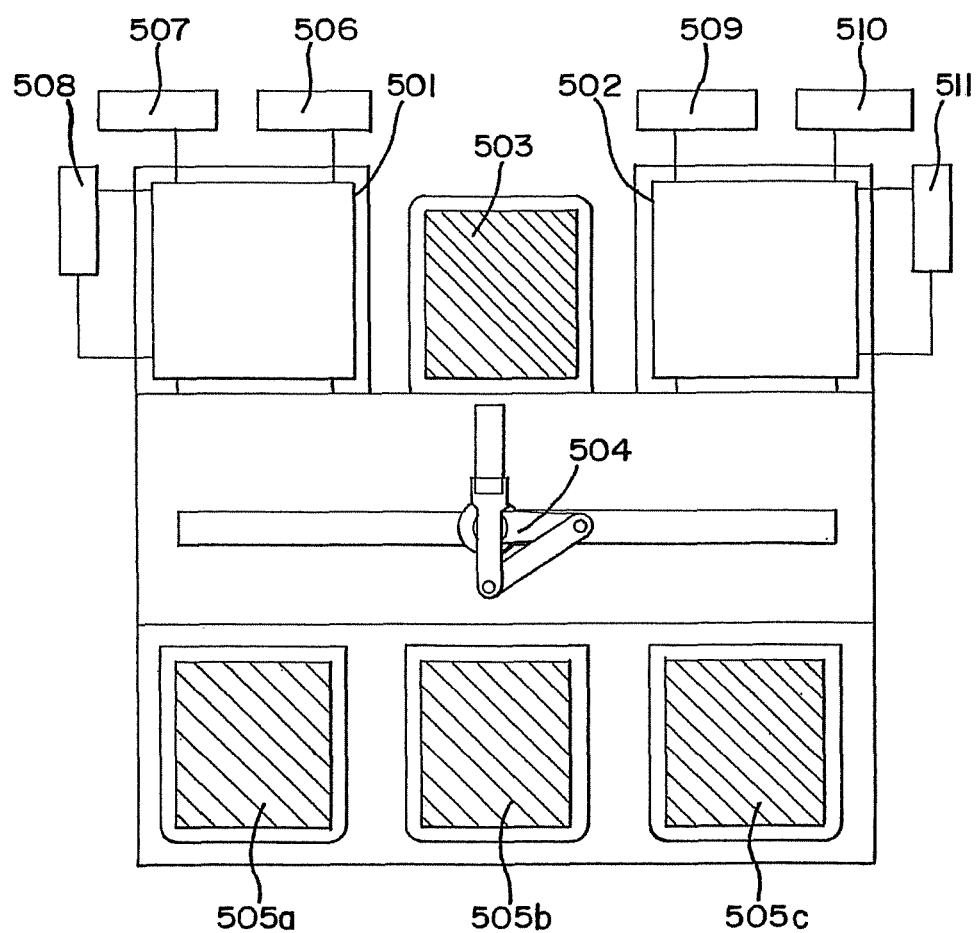

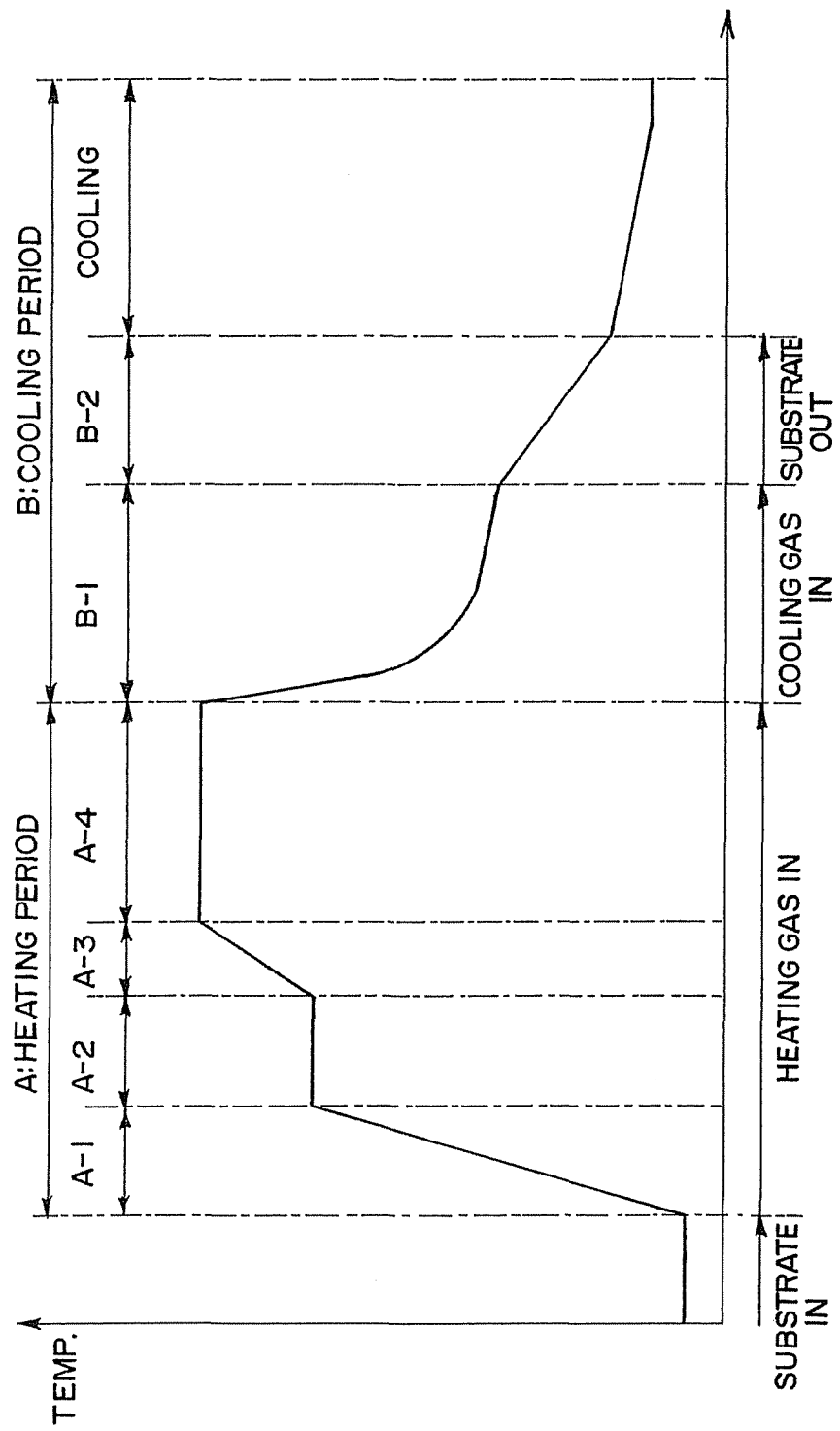

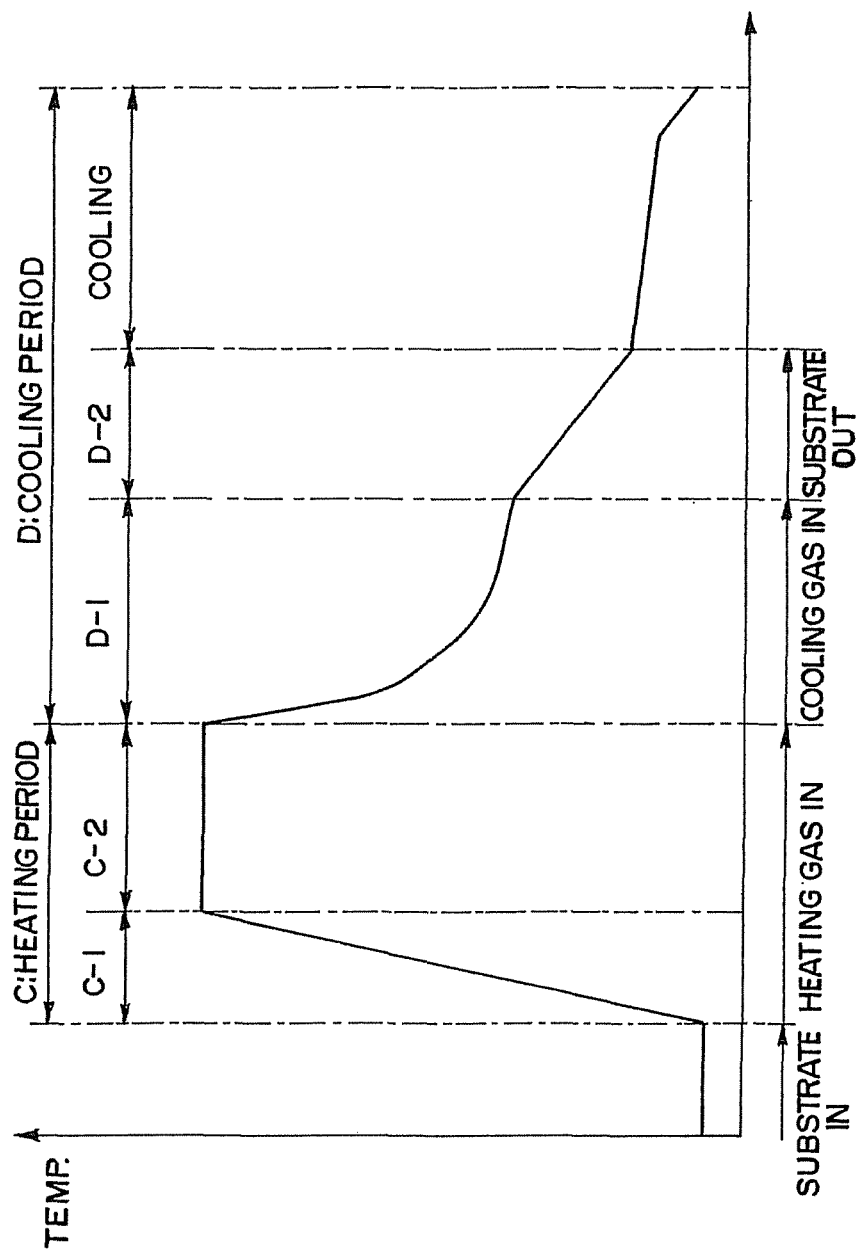

HEAT TREATMENT APPARATUS AND HEAT TREATMENT METHOD

This application is a divisional of U.S. application Ser. No. 11/511,929, filed on Aug. 29, 2006 now U.S. Pat. No. 7,974,524 which is a divisional of U.S. application Ser. No. 10/098,688, filed on Mar. 15, 2002 (now U.S. Pat. No. 7,118,780 issued Oct. 10, 2006).

BACKGROUND OF THE INVENTION

1. Field of the Invention

The present invention relates to a heat treatment method and to a heat treatment apparatus applying the heat treatment method. In particular, the present invention relates to a method of heat treatment, and a heat treatment apparatus, in which a gas is heated by thermal radiation from a heat generator such as a lamp, and then a substrate to be processed, or formations on the substrate to be processed, are then heated by using the heated gas.

2. Description of the Related Art

Heat treatment processes for objectives such as oxidation, diffusion, gettering, and crystallization after ion injection with respect to semiconductors and semiconductor substrates are incorporated into methods of manufacturing semiconductor devices. Horizontal and vertical hot wall type annealing furnaces are typical examples of apparatuses for performing such heat treatment.

Horizontal and vertical annealing furnaces are batch type devices for processing a plurality of substrates at a time. For example, substrates are loaded horizontally and in parallel into a susceptor made from quartz with vertical annealing furnaces, and the substrates are taken into, and removed from, a reaction chamber by using a vertical motion elevator. Heaters are disposed in the periphery of a bell jar type reaction chamber, and the substrates are heated by using the heaters. The amount of time necessary for heat up until achieving a predetermined heat treatment temperature, and the amount of time necessary for cooling to a temperature at which it is possible to remove the substrates, are relatively long.

However, extremely precise process accuracy are required for devices such as MOS transistors used in integrated circuits due to their miniaturization. In particular, it is necessary to keep the diffusion of impurities to the minimum possible when forming shallow junctions. It is difficult to form shallow junctions with furnace annealing processes that require a lot of time for heat up and cool down.

Rapid thermal annealing (hereafter referred to as RTA) has been developed as a heat treatment technique for performing rapid heating and rapid cooling. With RTA, substrates or formations on the substrates are heated quickly using means such as an infrared lamp, making it possible to perform heat treatment in a short amount of time.

On the other hand, the use of thin film transistors (hereafter referred to as TFTs) has been gathering attention as a technique in which it is possible to form integrated circuits directly on a glass substrate. Development of applications of this technique to new electronic devices such as liquid crystal display devices has been advancing. In particular, heat treatment for activation and in order to relieve distortions is necessary for TFTs in which impurity regions such as source and drain regions are formed in a polycrystalline semiconductor film formed over a glass substrate. However, the distortion point of glass substrates is at best from 600 to 700° C., they have poor heat resistance, and easily break due to thermal shocks, which is a disadvantage.

With a conventional vertical or horizontal annealing furnace, it becomes difficult to ensure a uniform heat treatment temperature, if the substrate size is made large size, whether the substrates for forming integrated circuits are semiconductors or materials like glass or ceramics. In order to ensure a uniform temperature within the substrates, and between the substrates, it is necessary to consider the fluid characteristics of a gas flowing in the reaction chamber and to widen the gap (pitch) between the substrates to be processed, which are arranged horizontally and in parallel. For example, if one side of a substrate exceeds 500 mm in length, it then becomes necessary to open a substrate gap equal to or greater than 30 mm.

The apparatus size therefore necessarily becomes very large if the substrates to be processed are made large size. Further, a large amount of substrates are processed in one batch, thus the weight increases, and it is necessary to use a strengthened susceptor in order to hold the substrates to be processed. The weight thus further increases, and mechanical operation for conveying the substrates to be processed into and out of the apparatus becomes slower. Also, not only does the floor surface area of the heat treatment apparatus increase, it also even influences architectural costs for a building in order to ensure that its floor can withstand the load. The increased apparatus size thus starts a vicious cycle.

On the other hand, there is a prerequisite for sheet processing with the RTA method, and there is no extreme increase in the weight of the apparatus. However, differences in the absorption of lamp light, used as a heat treatment means, develop due to the characteristics of the substrates to be processed, and the formations on the substrates. For example, for a case in which a metallic wiring pattern is formed on a glass substrate, a phenomenon arises in which the metallic wirings are heated preferentially, localized distortions develop, and the glass substrates break. It is therefore necessary to have complex control in the heat treatment process, such as with the regulation of the speed of temperature increase.

SUMMARY OF THE INVENTION

With a goal of resolving the above-stated problems, an object of the present invention is to provide a method of activating impurity elements added to a semiconductor film, and a method of gettering, in a process of manufacturing a semiconductor device using a substrate having a low resistance to heat, such as glass, without changing the shape of the substrate, by using a short time heat treatment process. An object of the present invention is also to provide a heat treatment apparatus that makes this type of heat treatment process possible.

In order to solve the above-mentioned problems, a heat treatment apparatus according to a first structure of the present invention comprises: means for supplying a gas from an upstream side of the reaction chamber; means for heating the gas on the upstream side of the reaction chamber; means for holding a substrate to be processed on a downstream side of the reaction chamber; and means for circulating the gas from the downstream side of the reaction chamber to the upstream side of the reaction chamber.

Other than the above-mentioned structure, a heat treatment apparatus according to the present invention may comprise: a reaction chamber having an intake portion for inhaling a gas, and an exhaust portion for expelling the inhaled gas; heat treatment means for heating the inhaled gas in the reaction chamber; means for supplying the heated gas to a substrate to be processed that is disposed within the reaction chamber; and means for circulating the gas expelled from the exhaust portion to the intake portion.

The reaction chamber comprises quartz or ceramic in order to prevent contamination from the inner walls. One means, or a plurality of means, selected from the group consisting of a halogen lamp, a metal halide lamp, a high pressure mercury lamp, a high pressure sodium lamp, and a xenon lamp is applied as a heat treatment means, but the efficiency becomes poor if the gas is directly heated by radiant light from the lamp. The heat treatment means is preferably formed in combination of a heat generating means and a heat absorber for absorbing thermal radiation from the heat generating means. The gas can thus be heated by heat conduction from the heat absorber, which is heated by absorbing radiant light from the heat generating means, with this combination. The thermal transmission efficiency can be made better by increasing the amount of surface area of the heat absorber that is contacting the gas.

Further, electric power used to heat the gas can be saved by circulating the gas used to heat the substrates to be processed. A portion of the circulating gas may be expelled, and can be utilized as a heat source for preheating a gas that is newly introduced.

As a structure in which the preheating effect of the heated and circulating gas is actively used, a heat treatment, apparatus may also be prepared with: means for supplying the gas from the upstream side of the reaction chamber, through a heat exchanger; means for heating the gas on the upstream side of the reaction chamber; means for holding a substrate to be processed on the downstream side of the reaction chamber; and means for supplying the gas from the downstream side of the reaction chamber to the heat exchanger.

Further, other than the above-mentioned structures, a heat treatment apparatus according to the present invention may comprise: a reaction chamber having an intake portion for inhaling a gas, and an exhaust portion for expelling the inhaled gas; a heat exchanger formed on an upstream side of the intake portion; means for supplying the gas through the heat exchanger; heat treatment means for heating the inhaled gas in the reaction chamber; means for supplying the gas, heated by the heat treatment means, to a substrate to be processed that is disposed within the reaction chamber; and means for supplying the gas expelled from the exhaust portion to the heat exchanger.

As a structure in which a plurality of processing chambers are formed, and a heated gas is utilized with good thermal efficiency, there may also be used a heat treatment apparatus having a processing chamber formed for holding a substrate and performing heat treatment, and supplying a gas heated by a heat treatment means to the processing chamber, to heat the substrate, in which: the plurality of processing chambers are formed; and heat treatment of a plurality of the substrates simultaneously is possible by flowing the heated gas sequentially to the plurality of processing chambers. A supplemental heat treatment means may also be formed between each of the processing chambers so that the temperature of the gas flowing between the plurality of processing chambers is made constant. The heated and circulating gas can also be utilized as a heat source for heating a newly introduced gas, through a heat exchanger.

There may be used a heat treatment apparatus according to a second structure having such functions, in which: the gas supply means is connected to the entrance port of the first gas heat treatment means, through the heat exchanger; the entrance port of the first processing chamber is connected to the exhaust port of the first gas heat treatment means; the exhaust port of the first processing chamber is connected to the entrance port of the second gas heat treatment means; the entrance port of the second processing chamber is connected to the exhaust port of the second gas heat treatment means; the exhaust port of the second processing chamber is connected to the heat exchanger; and a substrate is heated using a gas heated by a heat treatment means as a heat source.

In addition to the above structures, there may be used one in which: a gas supplied from a gas supply means is supplied to a first heat treatment means, through a heat exchanger; the gas heated by the first heat treatment means is supplied to a first processing chamber; the gas supplied to the first processing chamber is supplied to a second heat treatment means; the gas heated by the second heat treatment means is supplied to a second processing chamber; the gas supplied to the second processing chamber is supplied to the heat exchanger and used as a heat source in order to heat a gas supplied from the gas supply means; and a substrate is heated, using the gas heated by the heat treatment means as a heat source.

The processing chambers are formed by quartz or ceramic in order to prevent contamination from the inner walls. The first processing chamber and the second processing chamber are connected by a gas pipe, the gas heated by the heat treatment means flows from the first processing chamber to the second processing chamber, and thus energy used in order to heat the gas can be economized. Of course the gas temperature falls at this point, and therefore a gas heat treatment means may be placed between the first processing chamber and the second processing chamber, thus making the temperature of the gas flowing between the processing chambers constant.

The number of processing chambers connected by gas pipes can be predetermined. That is, another structure of a heat treatment apparatus of the present invention is a heat treatment apparatus having n (where n>2) processing chambers and n heat treatment means, in which: an entrance port of the m-th (where $1 \leq m \leq (n-1)$) processing chamber is connected to an exhaust port of the m-th gas heat treatment means; the entrance port of the n-th processing chamber is connected to the exhaust port of the n-th gas heat treatment means; the exhaust port of the n-th processing chamber is connected to a heat exchanger; and a substrate is heated using the gas heated by the heat treatment means as a heat source.

In addition to the above structure, there may be used a heat treatment apparatus having n (where n>2) processing chambers and n heat treatment means, in which: a gas heated by the m-th (where $1 \leq m \leq (n-1)$) heat treatment means is supplied to the m-th processing chamber; the gas supplied to the m-th processing chamber is heated by the (m+1)-th heat treatment means, and supplied to the (m+1)-th processing chamber; the gas supplied to the n-th processing chamber is supplied to a heat exchanger; the gas supplied from a gas supply means is used as a heat source for heat treatment; and a substrate is heated with the gas heated by the heat treatment means used as a heat source.

Further, the gas supply means can be structured with a first gas supply means connected to the gas heat treatment means and using a heated gas, and with a second gas supply means connected to each processing chamber and using a cooled gas. The amount of time required for heating and cooling of a workpiece to be processed can be shorted by supplying the heating gas and the cooling gas using different systems, and throughput can thus be increased.

A structure of this type of heat treatment apparatus of the present invention has a first gas supply means, a gas heat treatment means, and a plurality of processing chambers, in which: the first gas supply means is connected to piping coupled in series to the plurality of processing chambers, through the gas heat treatment means; the second gas supply means is connected to the piping coupled in parallel to each of the plurality of processing chambers; and a substrate is heated using a gas heated by the heat treatment means as a heat source.

Heating with good uniformity can be performed, without being influenced by the material properties of formations on the substrate to be processed, by heating the substrate using the heated gas. It is thus possible to perform heat treatment without causing localized distortions developing, and it becomes easy to accomplish heat treatment of fragile substrates such as glass by using rapid heating.

A method of heat treatment using heat treatment apparatus prepared with the first structure of the present invention is a method in which: a gas is supplied from the upstream side of a reaction chamber; the gas is heated by a heat treatment means located on the upstream side, and then flows to the downstream side; and a substrate to be processed, placed on the downstream side of the reaction chamber, is heated while the gas is circulated from the downstream side of the reaction chamber to the upstream side.

Further, another method is a method in which: a gas is supplied from an intake portion of a reaction chamber; the gas is heated by a heat treatment means located within the reaction chamber, and then flows to the downstream side; after the gas is expelled from an exhaust portion of the reaction chamber, it is supplied again from the intake portion; and a substrate to be processed, disposed within the reaction chamber, is heated while circulating the gas.

Heating with good uniformity can be performed, without being influenced by the material properties of formations on the substrate to be processed, by heating the substrate using the heated gas. It is thus possible to perform heat treatment without causing localized distortions developing, and it becomes easy to accomplish heat treatment of fragile substrates such as glass by using rapid heating.

A method of heat treatment using a heat treatment apparatus prepared with the second structure of the present invention is a method in which: a gas is supplied from a gas supply means to a first gas heat treatment means, through a heat exchanger; the gas is heated by the first gas heat treatment means; the heated gas is supplied to a first processing chamber; the gas, expelled from the first processing chamber, is heated by a second gas heat treatment means; the heated gas is supplied to a second processing chamber; the gas, expelled from the second processing chamber, is supplied to the heat exchanger; and a substrate disposed in the processing chamber is heated, with the gas heated by the heat treatment means used as a heat source.

Further, another method is a heat treatment method having n (where n>2) processing chambers and n gas heat treatment means, in which: a gas heated by the m-th (where 1≤m≤(n−1)) heat treatment means is supplied to the m-th processing chamber; the gas supplied to the m-th processing chamber is heated by the (m+1)-th heat treatment means, and supplied to the (m+1)-th processing chamber; the gas supplied to the n-th processing chamber is then supplied to a heat exchanger; and substrates disposed in the n processing chambers are heated by using the gas supplied from the gas supply means as a heat source for heating.

Further, another method is a heat treatment method in which: a gas is supplied from a first gas supply means to a first gas heat treatment means, through a heat exchanger; the gas is heated by the first gas heat treatment means; the heated gas is supplied to a first processing chamber; the gas, expelled from the first processing chamber, is heated by a second gas heat treatment means; a heating period is present for supplying the heated gas to the second processing chamber; the gas is supplied to the first processing chamber and the second processing chamber from a second gas supply means, without passing the heat treatment means; and a cooling period is present for cooling substrates disposed in the processing chambers.

Further, another method is a method of heat treatment having n (where n>2) processing chamber and n gas heat treatment means, in which: a gas supplied from a first gas supply means is heated by the m-th (where 1≤m≤(n−1)) heat treatment means and supplied to the m-th processing chamber; the gas supplied to the m-th processing chamber is heated by the (m+1)-th heat treatment means and supplied to the (m+1)-th processing chamber; the gas supplied to the n-th processing chamber is supplied to a heat exchanger; a heating period is present for heating substrates disposed in the n processing chamber, using the gas supplied from the gas supply means as a heat source for heating; a cooling gas is supplied to the n processing chambers from a second gas supply means; and a cooling period is present for cooling the substrates disposed in the processing chambers.

It thus becomes possible to perform uniform heating of glass substrates, on which predetermined patterns have been formed from metals, semiconductors, insulators, and the like, without localized thermal distortions developing, by using a heated gas as in the aforementioned structures. In addition, the thermal efficiency can be raised by circulating the heated gas, and the amount of energy consumption needed for heat treatment can be reduced.

Inert gasses such as nitrogen and rare gasses, reducing gasses such as hydrogen, and oxidizing gasses such as oxygen, nitrous oxide, and nitrogen dioxide can be used for the gas applied in the present invention.

If an inert gas such as nitrogen or a rare gas is used, then it can be applied to heat treatment processes for crystallizing an amorphous semiconductor film, heat treatment processes for gettering, and heat treatment processes for recrystallization and activation after ion injection or ion doping (a method of injecting ions without separation of mass).

If hydrogen or hydrogen diluted by an inert gas is used as a reducing gas such as hydrogen, then hydrogenation processing for repairing semiconductor defects (dangling bonds) can be performed.

If an oxidizing gas such as oxygen, nitrous oxide, or nitrogen dioxide is used, then an oxide film can be formed on a semiconductor substrate or a semiconductor film.

BRIEF DESCRIPTION OF THE DRAWINGS

In the accompanying drawings:

FIG. 8 is a schematic diagram for explaining a heat treatment method of the present invention;

FIG. 14 is a layout diagram showing an embodiment of a heat treatment apparatus applying a heat treatment method of the present invention;

FIG. 15 is a graph for explaining substrate temperature changes in a crystallization process using a heat treatment method of the present invention; and FIG. 16 is a graph for explaining substrate temperature changes in a gettering process using a heat treatment method of the present invention.

DETAILED DESCRIPTION OF THE PREFERRED EMBODIMENTS

Embodiment 1

Figure 1:
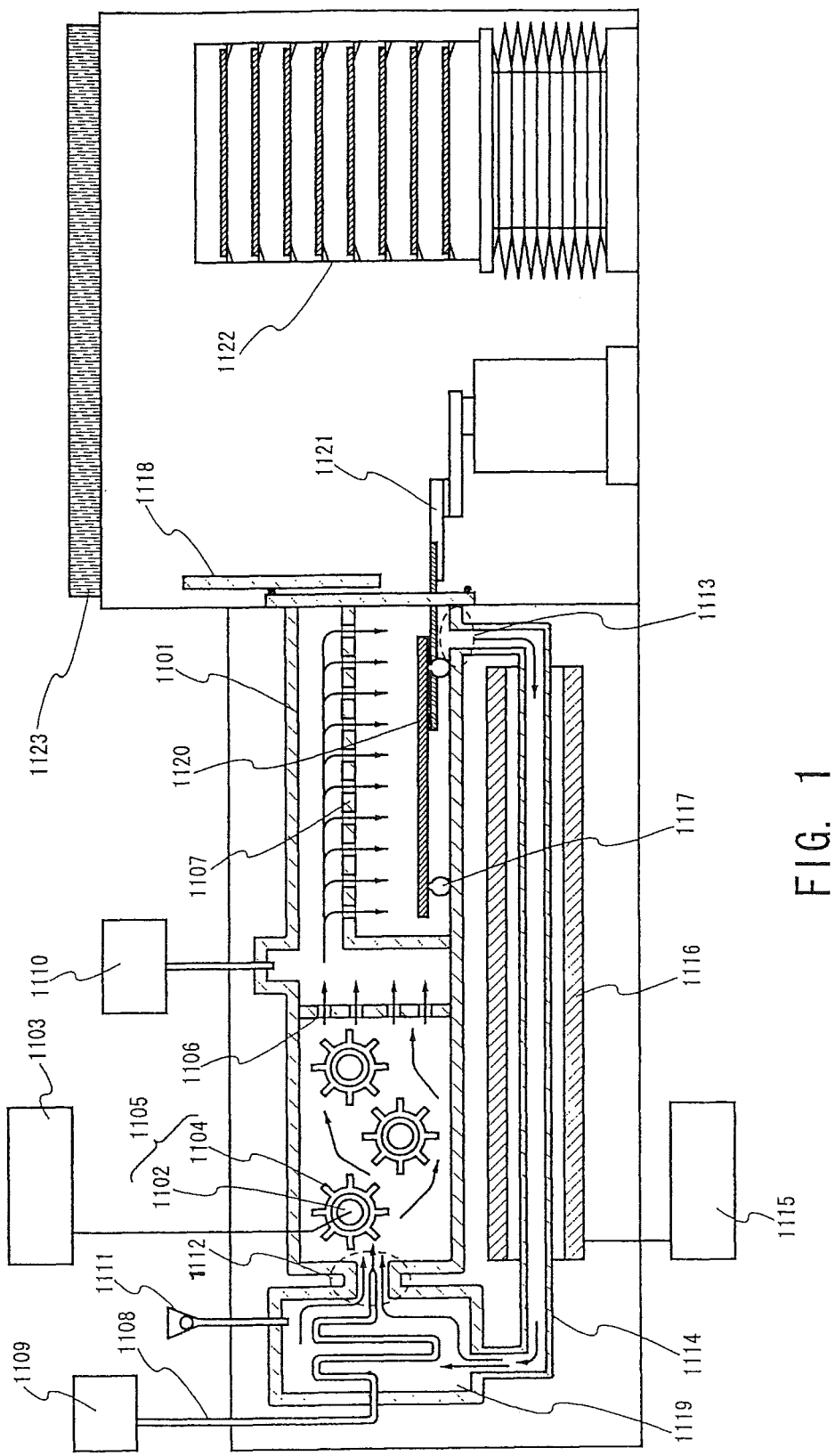
FIG. 1 is a cross sectional structure diagram showing an embodiment of a heat treatment apparatus applying a heat treatment method of the present invention.
Figure 2:
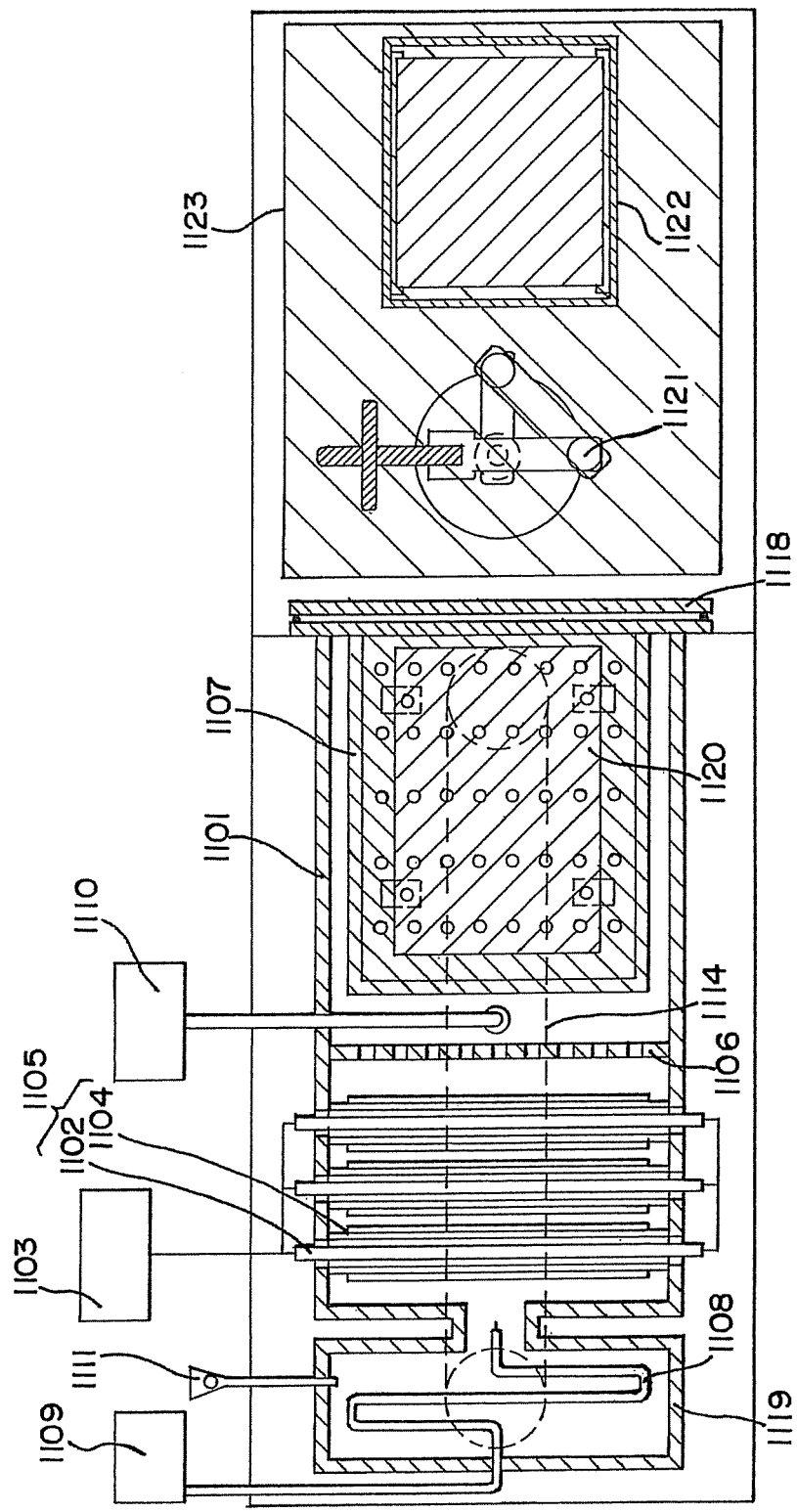
FIG. 2 is an upper surface structural diagram showing an embodiment of a heat treatment apparatus applying a heat treatment method of the present invention.

An embodiment of the present invention is explained below using FIG. 1 and FIG. 2. FIG. 1 is a cross sectional diagram showing an embodiment of a heat treatment apparatus applying a heat treatment process of the present invention, and FIG. 2 is an upper surface diagram corresponding to FIG. 1. Common reference numerals are used in FIGS. 1 and 2 in order to clarify the correspondences.

The heat treatment apparatus shown in FIG. 1 and in FIG. 2 is prepared with a heat treatment means 1105, made from a heat generator 1102 and a heat absorber 1104, in a reaction chamber 1101, a heat generator control device 1103, a gas supply means 1109 and 1110, and a pressure control valve 1111.

The reaction chamber uses quartz or ceramic in order to avoid contamination from its inner walls. Quartz is a material normally used often as a reaction chamber material. Further, if substrate size becomes large, it is then difficult to form the reaction chamber using quartz while conforming to the substrate size, and therefore ceramic may be applied in this case.

A lamp such as a halogen lamp, a metal halide lamp, a high pressure mercury lamp, a high pressure sodium lamp, or a xenon lamp is used in the heat generator 1102 in the heat treatment means 1105. The heat generator control device 1103 is a device for controlling the heat generator 1102 so as to obtain a predetermined temperature or a predetermined amount of thermal radiation. A gas absorbs radiation from the heat generator 1102, or the heat generator 1102 and the gas are placed in contact, and heating takes place. Further, as shown in FIGS. 1 and 2, the heat absorber 1104 is formed in the periphery of the heat generator 1102 using a material such as quartz, SiC, or Si. Radiation from the heat generator 1102 is absorbed temporarily by the heat absorber 1104, and the gas may be heated by heat conduction from the heat absorber 1104. It is preferable at this point to use a structure in which fins are formed on surfaces of the heat absorber 1104, so as to increase the surface area for contact with the gas. The heat treatment means 1105 is thus located on the upstream side of the reaction chamber 1101.

Orifice plates 1106 and 1107 are formed between a region in which the heat generator 1102 is located, and a region in which a substrate 1120 is disposed. Pores are formed in the orifice plates 1106 and 1107 with the aim of controlling the flow speed and flow direction of the gas. The orifice plate 1106 is disposed so that the gas stays in the region in which the heat generator 1102 is located, and the orifice plate 1107 is located in order to make the gas flow in from a direction perpendicular to the substrate 1102.

The gas is guided by a nozzle 1108 from a gas supply means 1109 to an intake portion 1112, through a heat exchanger 1119, and the gas is introduced within the reaction chamber 1101. The gas introduced to the reaction chamber 1101 passes through the region in which the heat generator 1102 is located, and through the orifice plates 1106 and 1107, and is then expelled from an exhaust portion 1113 placed on the downstream side of the reaction chamber 1101. The expelled gas is returned to the upstream side by a connecting pipe 1114 and again flows into the reaction chamber 1101 from the intake portion 1112, through the heat exchanger 1119. The gas is thus made to circulate. Further, a portion of the gas may be released to the atmosphere from the pressure control valve 1111. The pressure control valve 1111 is used in order to maintain a predetermined pressure within the reaction chamber 1101.

The gas heated by the heat exchanger 1119 circulates, and the gas supplied from the gas supply means 1109 can be preheated in advance in accordance with heating the nozzle 1108. Convection develops in a direction shown by arrows in the figures in accordance with injecting the gas from the tip of the nozzle 1108. A portion of the heated gas that circulates and returns to the heat exchanger 1119 once again flows into the reaction chamber 1101 from the intake portion 1112.

Of course the temperature of the circulating gas is lower than the original temperature, but the heating efficiency is increased by using this type of closed system, and the amount of electric power consumed can be economized. A heater 1116 may also be formed in the periphery of the connecting pipe 1114 (reference numeral 1115 denotes an electric power source of the heater).

The substrate to be processed 1120 is set within the reaction chamber on a holding means 1117. The structure of the holding means 1117 is one that makes the area of contact with the substrate to be processed 1120 extremely small. A gate valve 1118 is located in an edge of the reaction chamber 1101, and the substrate to be processed can be taken into, and taken out from, the reaction chamber 1101 by opening and closing the gate valve 1118. The substrate to be processed 1120 is loaded into a cassette 1122, and this is carried into and out of the reaction chamber by using a conveyor means 1121. The conveyor means 1121 and the cassette 1122 are preferably placed below a cleaning unit 1123, which blows in clean air, in order to prevent contamination of the substrate to be processed 1120 by the peripheral environment.

An example of a heat treatment process is shown next. The substrate to be processed is set into the holding means 1117, and the gas used for heat treatment is supplied from the gas supply means after closing the gate valve. This is maintained until the supplied gas fills the reaction chamber, after which the gas is heated by the heat treatment means 1105. The heated gas is then passed through the orifice plates 1106 and 1107, and exposed to the substrate to be processed 1120, heating it. Next, the gas passes through the heat exchanger 1119 from the exhaust portion 1113, and is supplied again from the intake portion 1112 to the inside of the reaction chamber 1101. The heated gas thus performs heat treatment of the substrate to be processed 1120 by circulating.

After a predetermined amount of time has passed, heating of the gas is stopped by the heat treatment means 1105. A cooling gas is then supplied from the gas supply means 1110 in order to cool the substrate to be processed 1120. The temperature of the gas within the reaction chamber is cooled by the influx of the cooling gas, and the temperature of the substrate to be processed 1120 can be reduced. The gate valve 1118 is opened next, and the substrate to be processed 1120 is removed by the conveyor means. Heat treatment of the substrate to be processed 1120 can thus be performed in a short amount of time.

The heat treatment method of the present invention, and the heat treatment apparatus applying the heat treatment method, are assumed to use batch processing, but the gas is heated and then the substrate to be processed is heated by direct contact, and therefore the temperature rises in a relatively short amount of time. Further, the substrate to be processed can be swiftly cooled from its high temperature state by the use of the gas having a temperature on the order of room temperature. Care is necessary, of course, for cases in which a substrate that is weak with respect to thermal shock, such as glass, is used. However, this method of heat treatment differs from the instantaneous heating over several microseconds to several seconds using lamp light that occurs in conventional RTA, and the substrate does not break by sudden heating with the heat treatment method of the present invention.

The gas used in heating and cooling can be selected in accordance with the reason for performing heat treatment. If an inert gas such as nitrogen or a rare gas is used, then it can be applied to heat treatment processes for crystallizing an amorphous semiconductor film, heat treatment processes for gettering, and heat treatment processes for recrystallization and activation after ion injection or ion doping (a method of injecting ions without separation of mass). If hydrogen or hydrogen diluted by an inert gas is used as a reducing gas such as hydrogen, then hydrogenation processing for repairing semiconductor defects (dangling bonds) can be performed. Furthermore, if an oxidizing gas such as oxygen, nitrous oxide, or nitrogen dioxide is used, then an oxide film can be formed on a semiconductor substrate or a semiconductor film.

Figure 3:
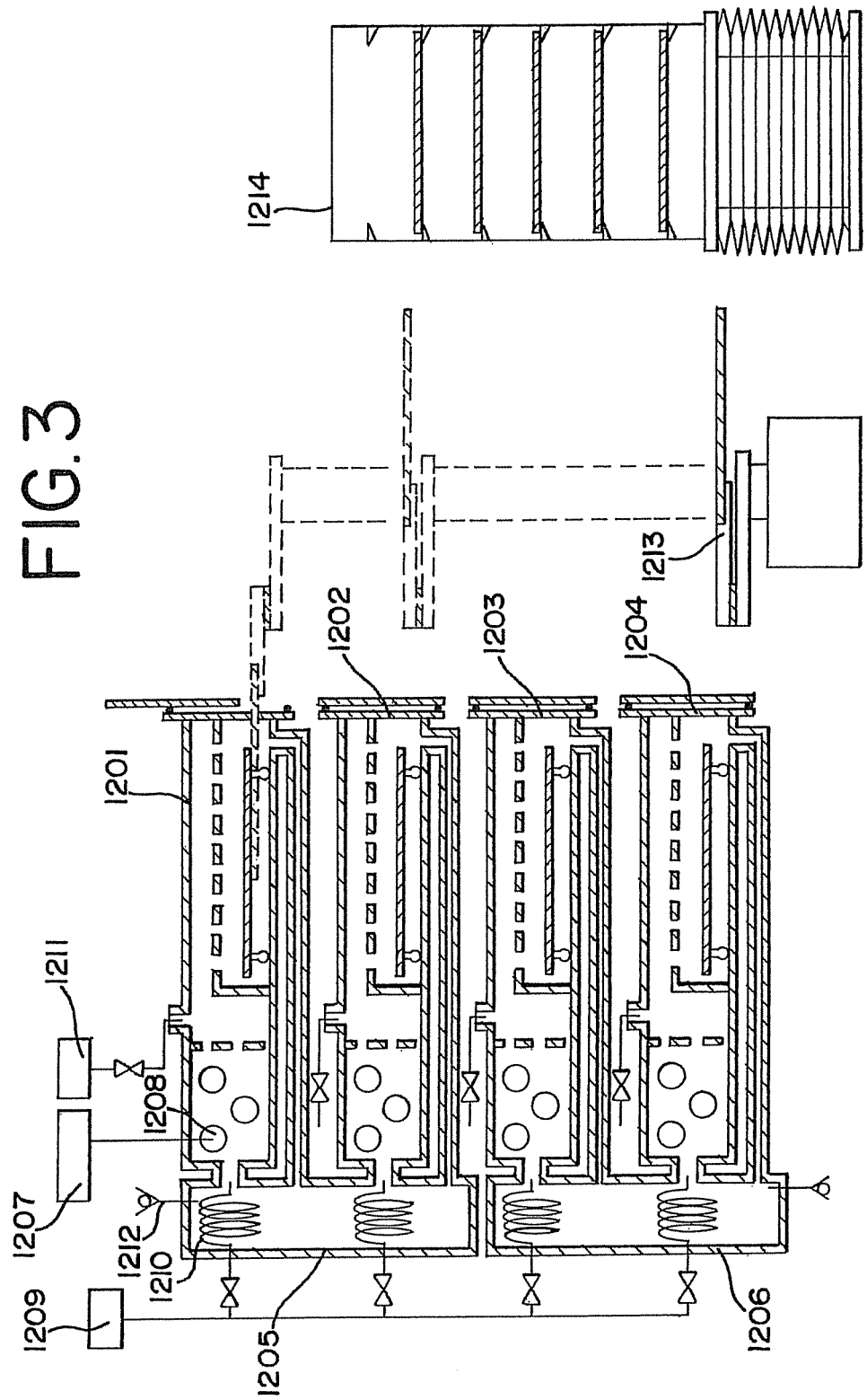
FIG. 3 is a cross sectional structure diagram showing an embodiment of a heat treatment apparatus applying a heat treatment method of the present invention.

The structure shown in FIG. 3 can be applied in order to increase the processing capacity. Reaction chambers 1201 to 1204 in FIG. 3 are similar to those of FIG. 1. They are prepared with a heat treatment means 1208, a control device 1207 to control the heat treatment means, a pressure control valve 1212, and gas supply means 1209 and 1211.

It is not necessary to have a one-to-one correspondence between heat exchangers and the reaction chambers, and therefore a heat exchanger 1205 may correspond to the reaction chambers 1201 and 1202, and a heat exchanger 1206 may correspond to the reaction chambers 1203 and 1204. This type of structure is possible if the performance of heat treatment at the same temperature in the plurality of reaction chambers is taken as a prerequisite. A gas is supplied to each of the reaction chambers from the gas supply means 1209, through a nozzle 1210. In addition, conveyor means and cassettes similar to those of FIG. 1 are employed for a conveyor means 1213 and for a cassette 1214.

The heat treatment apparatus having the structure shown in FIG. 3 makes it possible to perform heat treatment at a different temperature in the reaction chambers 1201 and 1202 than the temperature in the reaction chambers 1203 and 1204, and at different processing times.

Figure 4:
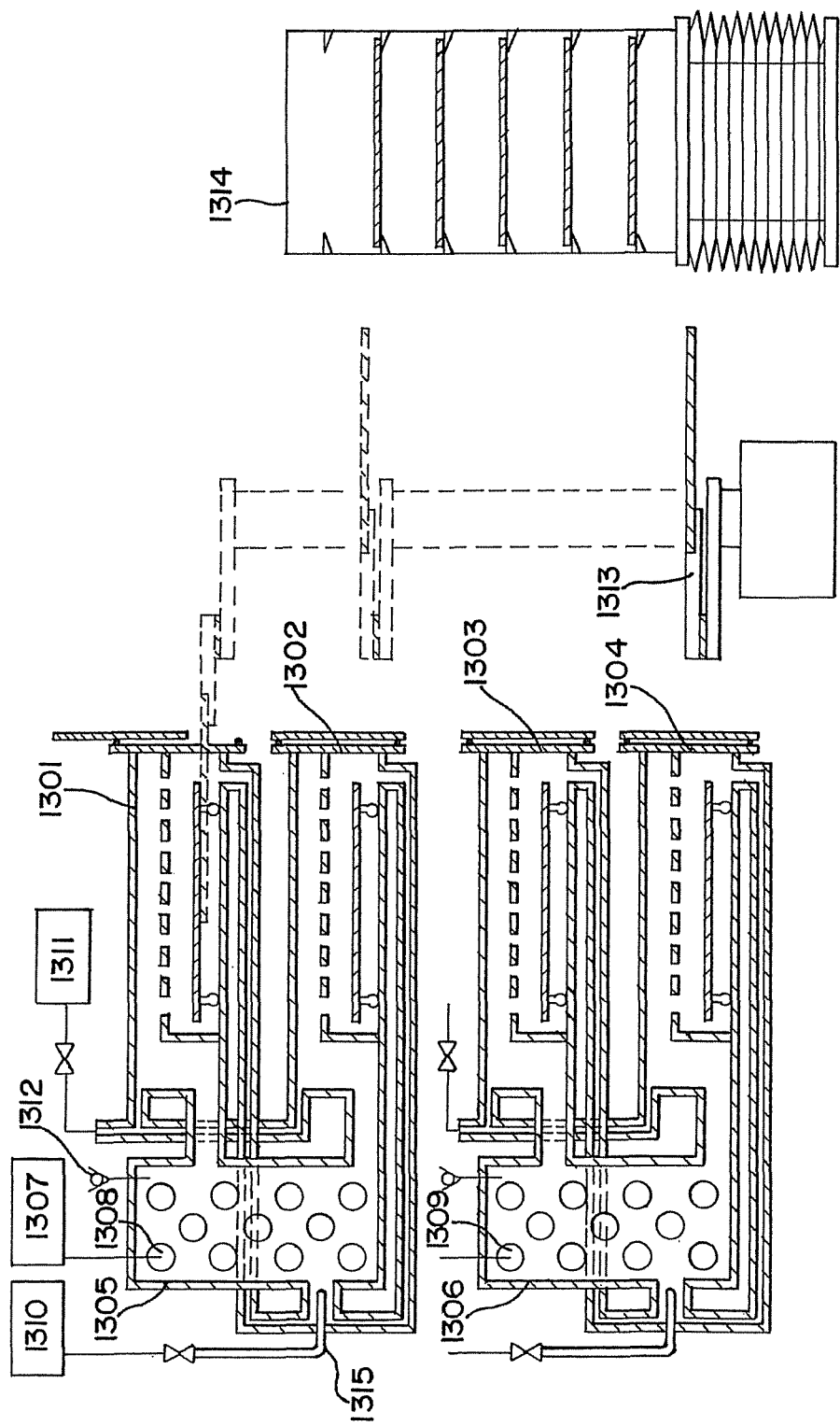
FIG. 4 is a cross sectional structure diagram showing an embodiment of a heat treatment apparatus applying a heat treatment method of the present invention.

Further, a heat treatment apparatus shown by FIG. 4 shows an embodiment in which the heat exchanger has been omitted. A heat treatment means 1308 and a control device 1307 are shared between reaction chambers 1301 and 1302 here. Furthermore, a heat treatment means 1306 and a control device 1307 are shared between reaction chambers 1303 and 1304. A pressure control valve 1312 and gas supply means 1310 and 1311 are also prepared.

The heat exchanger is omitted, but a structure in which a gas used in heating is supplied from the gas supply means 1310 via the nozzle 1315, and then the gas heated by the heat generator 1308 and 1309 in the heat treatment means 1305 and 1306 circulates, is similar to the structure of FIG. 1. In addition, a conveyor means 1313 and a cassette 1314 are similar to those employed in FIG. 1.

Figure 5:
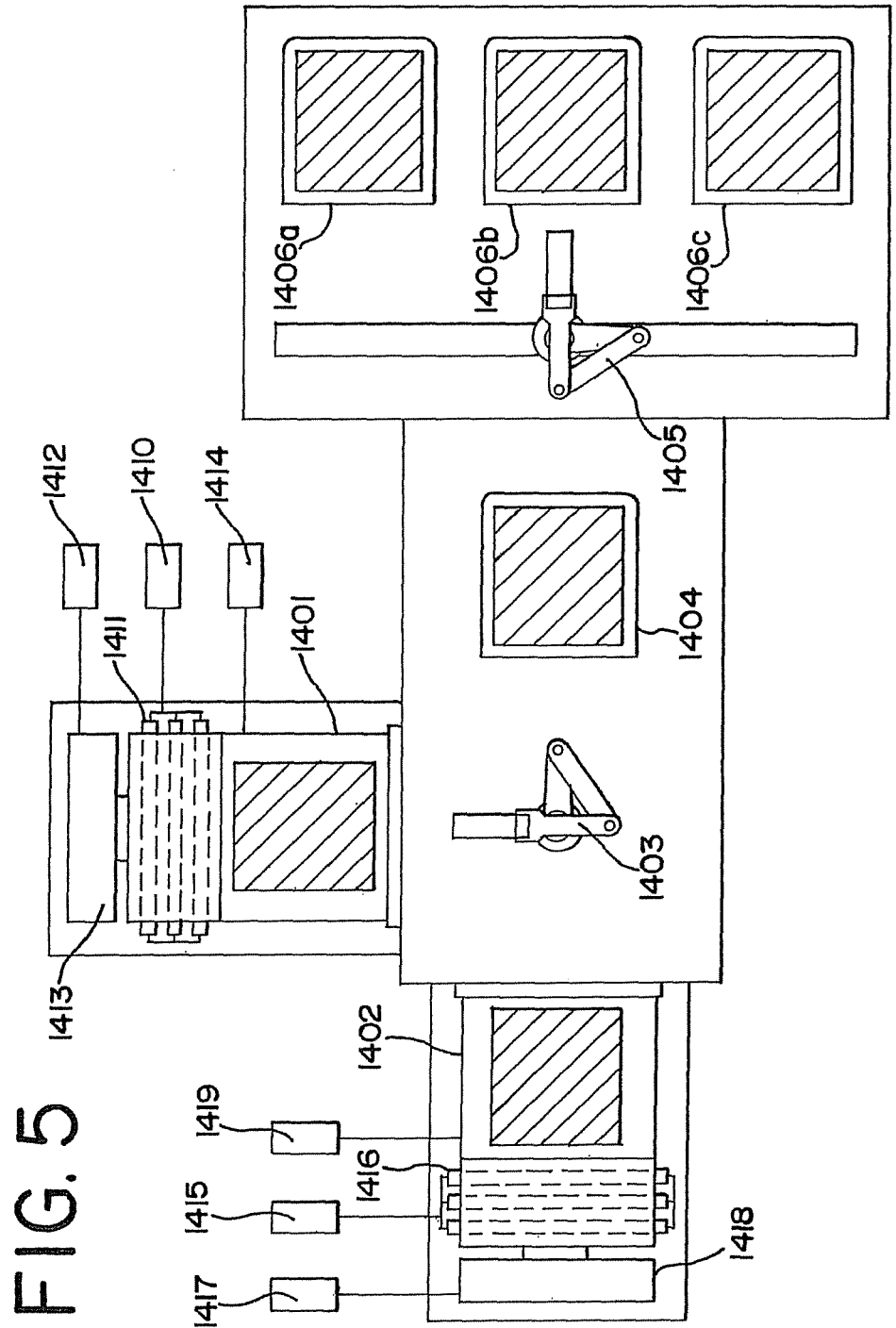
FIG. 5 is a cross sectional structure diagram showing an embodiment of a heat treatment apparatus applying a heat treatment method of the present invention.

FIG. 5 shows a structure of a heat treatment apparatus prepared with a plurality of reaction chambers. It is possible to employ any of the structures explained by FIG. 1, FIG. 3, and FIG. 4 for a reaction chamber 1401, a heat treatment means 1411, a control device 1410, gas supply means 1412 and 1414, and a heat exchanger 1413. Similarly, a reaction chamber 1402, a heat treatment means 1416, a control device 1415, gas supply means 1417 and 1419, and a heat exchanger 1418 are prepared. A conveyor means 1403 is used in order to transport a workpiece to be processed from the cassette 1404 to each of the reaction chambers. Symbols 1406a to 1406c denote cassettes prepared with workpieces to be processed, and the workpieces are supplied to the cassette 1404 by a conveyor means 1405.

FIG. 5 shows one example of a heat treatment apparatus structure using a large volume batch processing method, but it is not necessary to place limits on the structure and the configuration, and it is possible to use predetermined configurations. The heat treatment apparatus shown here is a batch processing method. This is a method in which substrates to be processed are heated by using a heated gas, and therefore heat treatment processing can be performed with good uniformity even if the substrate size becomes lame. For example, this method can also be applied to heat treatment of substrates in which the length of one side exceeds 1000 mm.

The heat treatment method of the present invention, and the heat treatment apparatus using this method, are not constrained by the shape or the size of the substrates to be processed. It is not necessary to use a strengthened susceptor even if the substrates to be processed are made large size due to the sheet processing, and the apparatus can thus be made smaller. Furthermore, it is not necessary to have a large scale heat treatment means, and energy consumption can be economized.

Embodiment 2

Figure 10:
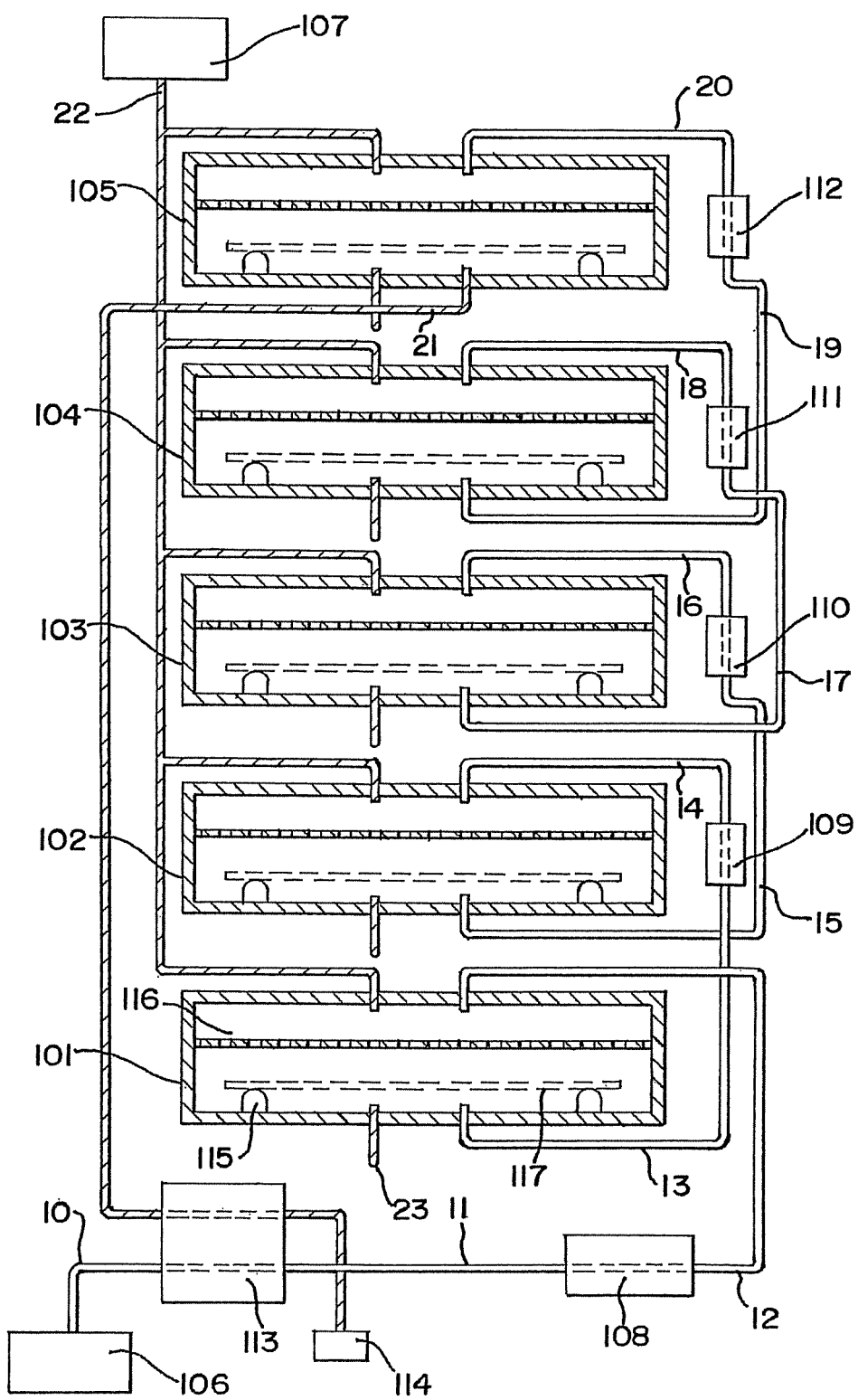
FIG. 10 is a cross sectional structure diagram showing an embodiment of a heat treatment apparatus applying a heat treatment method of the present invention.

FIG. 10 is a cross sectional diagram showing an embodiment of a heat treatment apparatus applying a heat treatment method of the present invention. A plurality of gas supply means, a plurality of gas heat treatment means, a plurality of processing chambers, and a heat exchanger are prepared in the heat treatment apparatus of the present invention.

A first gas supply means 106, a heat exchanger 113, and a first gas heat treatment means 108 are connected by gas pipes 10 and 11. A gas supplied from the first gas supply means 106 is heated in advance by the heat exchanger 113 and supplied to the first heat treatment means 108. The gas is then heated to a predetermined temperature by the first heat treatment means 108.

An exhaust port of the first heat treatment means 108 is connected to an intake port formed in the first processing chamber 101 by a gas pipe 12 to supply a heated gas. A substrate holding means 115 and a shower plate 116 for blowing the heated gas to the substrate are located within the first processing chamber 101. Further, the supplied gas is expelled from an exhaust port formed in the first processing chamber 101.

The processing chambers are formed using quartz or ceramic in order to prevent contamination form the walls when the heated gas is introduced to the processing chambers. Further, if the substrate size is made large, it then becomes difficult to form the processing chambers to a corresponding size using quartz, and therefore ceramic may be applied in such cases. The structure of the holding means 115 is one in which the surface area of contact with the substrate is made extremely small. The gas supplied to the processing chamber 101 passes through the shower plate 116 and is blown to the substrate. Fine openings are formed in the shower plate 116 at predetermined gaps, so that the heated gas is blown uniformly to the substrate. Heating with good uniformity can be performed, even if the substrate surface area becomes large, by using the shower plate 116.

The processing chamber structure is also similar for a second processing chamber 102, a third processing chamber 103, a fourth processing chamber 104, and a fifth processing chamber 105.

The heated gas supplied to the first processing chamber 101 is utilized to heat the substrate 117 placed on the substrate holding means 115, and the gas is next supplied to the second processing chamber 102 and again used to heat a substrate. The gas temperature drops during this step, and therefore the temperature is controlled by a second heat treatment means 109 so as to become a predetermined temperature. A gas pipe 13 connects an exhaust port formed in the first processing chamber with an intake port of the second heat treatment means 109. A gas pipe 14 connects an exhaust port of the second heat treatment means 109 with an intake port formed in the second processing chamber 102. Although not shown in the figure, a temperature insulation means may also be formed on the gas pipes.

The heated gas supplied to the second processing chamber 102 is similarly utilized in heating a substrate, and is then supplied to a third gas heat treatment means 110 by a gas pipe 15, and supplied to the third processing chamber 103 by a gas pipe 16. The heated gas supplied to the third processing chamber 103 is then supplied to a fourth gas heat treatment means 111 by a gas pipe 17, and is supplied to the fourth processing chamber 104 by a gas pipe 18. The heated gas supplied to the fourth processing chamber 104 is then supplied to a fifth gas heat treatment means 112 by a gas pipe 19, and is supplied to the fifth processing chamber 105 by a gas pipe 20.

The second processing chamber 102 and the third processing chamber 103 are connected by the gas pipes 15 and 16, with the third gas heat treatment means 110 in between the two. The third processing chamber 103 and the fourth processing chamber 104 are connected by the gas pipes 17 and 18, with the fourth gas heat treatment means 111 in between the two. In addition, the fourth processing chamber 104 and the fifth processing chamber 105 are connected by the gas pipes 19 and 20, with the fifth gas heat treatment means 112 interposed therebetween.

The gas supplied form the first gas supply means 106 is thus heated by the gas heat treatment means, and is then supplied in succession form the first processing chamber to the fifth processing chamber. The gas heat treatment means are formed between each of the processing chambers, and the temperature of the gas supplied to each processing chamber is made the same. The number of processing chambers may of course be predetermined, based on need, and no limitations are placed on the present invention by the number of processing chambers shown in this embodiment.

One substrate is set into each of the processing chambers. Each of the processing chambers is connected in series by the gas pipes, and the heated gas flows continuously. The amount of the gas used can thus be economized, and further, the amount of energy necessary for heating can also be economized.

A second gas supply means 107 is connected to piping 22 for supplying a gas in parallel to each of the plurality of processing chambers disposed. The second gas supply means 107 supplies a gas in order to cool the heated processing chambers and substrates. The temperature appropriate for the gas supply may be predetermined, and room temperature may also be used. The supplied gas is exhausted to the outside of the processing chambers by a drain pipe 23.

The heat exchanger 113 is located in order to preheat the gas supplied form the first gas supply means 106. The means for curing poisonous gas 114 is connected with the heat exchanger 113. The gas supplied from the first gas supply means is heated using the heat of the gas expelled form the fifth processing chamber 105. An exhaust port of the fifth processing chamber 105 is connected to the heat exchanger 113 by a gas pipe 21. The gas expelled form the fifth processing chamber 105 is cooled by passing through the heat exchanger 113. The supplied gas is thus heated using that heat. The energy necessary for heating the gas can thus be reduced.

Figure 13:
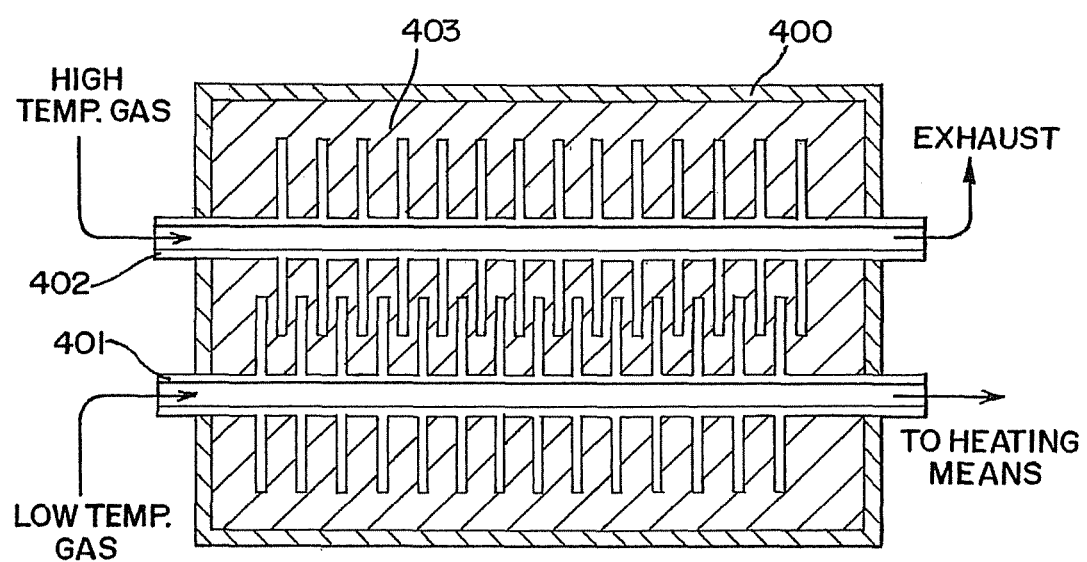
FIG. 13 is a diagram for explaining an example of a heat exchanger capable of being applied to a heat treatment apparatus of the present invention.

An example of the heat exchanger is shown in FIG. 13. Pipes 402 for intake of the high temperature gas and having fins as shown in FIG. 13, and pipes 403 for the outflow of the cooled gas (normally on the order of room temperature), also having fins as shown in the figure, are set in the heat exchanger. A frame 400 is filled with an oil 403 used as a medium for heat transfer. The fins are formed in order to increase the heat transfer efficiency, and the high temperature gas transfers heat to the oil 403, is cooled, and is expelled in accordance with this type of structure. Low temperature gas passing through the heat exchanger is heated by this heat. Although a simple example of a heat exchanger is shown here, the structure of heat exchangers capable of being applied to the present invention is not limited to that shown in FIG. 13. Other structures may also be employed.

Figure 12:
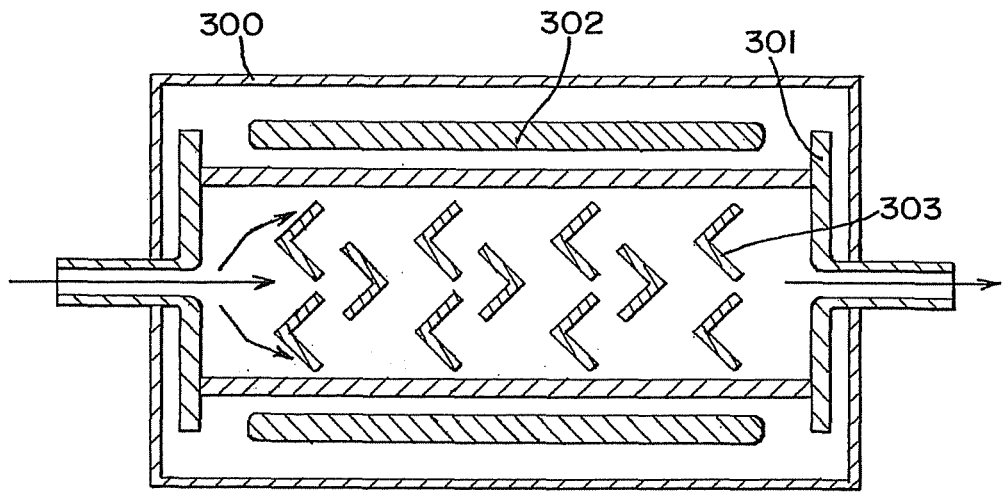
FIG. 12 is a diagram for explaining an example of a gas heat treatment means capable of being applied to a heat treatment apparatus of the present invention.

FIG. 12 shows an example of a structure of a gas heat treatment means. A heat absorber 303 is formed on the inside of a cylinder 301, through which the gas passes, in FIG. 12. A heat absorber formed by high purity titanium or tungsten, or by silicon carbide, quartz, or silicon is employed as the heat absorber 303. The cylinder 301 is formed by transparent quartz or the like, and the heat absorber 303 is heated by radiation from a light source 302 located on the outside. The gas contacts the heat absorber 303 and is heated. Contamination is prevented by setting the light source outside of the cylinder 301, and therefore the purity of the gas passing through the cylinder can be maintained. A vacuum may also be pulled inside of a frame 300, thus increasing the heat insulating effect.

Next, an example of a heat treatment procedure using the heat treatment apparatus having the structure shown in FIG. 10 is discussed. After setting substrates on the holding means in each of the processing chambers, the processing chamber 101 to the processing chamber 105, a gas is supplied from the first gas supply means 106. The gas is made to flow for a time without heating until it replaces the interior of each processing chamber and the interior of the pipes. Next, the gas is heated by the first gas heat treatment means 108, the second gas heat treatment means 109, the third gas heat treatment means 110, the fourth gas heat treatment means 111, and the fifth gas heat treatment means 112. The gas heated within the processing chambers is blown onto the substrates through the shower plates, and the substrates are heated. The heated gas makes a full round of each processing chamber and is supplied to the heat exchanger. The gas supplied from the first gas heat supply means 106 is then utilized as a heat source for heating.

After a predetermined amount of time has passed, heating of the gas by the gas heat treatment means 108 to 112 is stopped. A cooling gas for cooling the substrates is then supplied from the second gas supply means 107. The temperature of the gas within each of the processing chambers is thus reduced by the intake of the cooling gas, and the temperature of the substrate can be lowered. Heat treatment using the heat treatment apparatus of the present invention is then completed by removing the substrates.

The number of substrates that can be placed into the processing chambers changes in accordance with the size of the processing chambers and the size of the substrates. If one substrate placed in one processing chamber is taken as a basis, then the number of substrates that can be processed by running the heat treatment process once is determined by the number of processing chambers.

Further, it is preferable that the internal volume of the processing chambers be made as small as possible in order to economize the amount of a gas used and in order to increase the heating efficiency. The dimensions of the inside of the processing chambers is determined by the size of the substrates and the area of operation of a conveyor for taking the substrates into and out of the processing chambers. It is necessary to have an operation range on the order of 10 mm in order for the conveyor means to take the substrates into and out of the processing chambers, and therefore one of the dimensions of the processing chambers is determined by the thickness of the substrates and by the minimum operating range for the conveyor means.

The heat treatment method of the present invention, and the heat treatment apparatus applying the heat treatment method, are assumed to use batch processing, but the gas is heated and then the substrate to be processed is heated by direct contact, and therefore the temperature rises in a relatively short amount of time. Further, the substrate to be processed can be swiftly cooled from its high temperature state by the use of the gas having a temperature on the order of room temperature. Care is necessary, of course, for cases in which a substrate that is weak with respect to thermal shock, such as glass, is used. However, this method of heat treatment differs from the instantaneous heating over several microseconds to several seconds using lamp light that occurs in conventional RTA, and the substrate does not break by sudden heating with the heat treatment method of the present invention.

The gas used in heating and cooling can be selected in accordance with the reason for performing heat treatment. If an inert gas such as nitrogen or a rare gas is used, then it can be applied to heat treatment processes for crystallizing an amorphous semiconductor film, heat treatment processes for gettering, and heat treatment processes for recrystallization and activation after ion injection or ion doping (a method of injecting ions without separation of mass). If hydrogen or hydrogen diluted by an inert gas is used as a reducing gas such as hydrogen, then hydrogenation processing for repairing semiconductor defects (dangling bonds) can be performed. Furthermore, if an oxidizing gas such as oxygen, nitrous oxide, or nitrogen dioxide is used, then an oxide film can be formed on a semiconductor substrate or a semiconductor film.

The heat treatment apparatus applying the heat treatment method of the present invention, explained above, can be applied to heat treatment of various types of objects. For example, it can be applied to the heat treatment of a semiconductor substrate on which an integrated circuit is formed, to the heat treatment of an insulating substrate on which TFTs are formed, the heat treatment of metallic substrates, and the like. The heat treatment apparatus can be applied to the heat treatment of a glass substrate on which TFTs are formed, for example. Uniform substrate heating can be achieved even if the substrate size is 1200×1600 mm or another size, not only 600×720 mm. Furthermore, there is no need to made a jig for holding the substrate large.

Embodiment 3

An embodiment of a method of heat treatment of the present invention is explained using FIG. 8. Time progression (procedures) during heat treatment using the heat treatment apparatus of FIG. 1 is shown in FIG. 8. Nitrogen ($N_2$) is used as the heating gas and the cooling gas. Further, a halogen lamp is used as a heat generator.

A substrate to be processed is set within the reaction chamber from the cassette by the conveyor means, and the gate valve is then closed. During this period nitrogen continues to be supplied from the gas supply means to the inside of the reaction chamber, and this is considered to minimize the mixing in of the outside atmosphere. After closing the gate valve, the amount of nitrogen flow rate is increased, and the inside of the reaction chamber is replaced and filled by nitrogen.

The nitrogen flow rate is then increased, the halogen lamp heat generator is turned on, and the nitrogen is heated. The heating temperature can be regulated by the amount of electric power supplied to the heat generator, or by the amount of electric power supplied and the amount of nitrogen supplied. It is possible to have heating temperatures on the order of 100 to 1000° C.

The substrate set on the downstream side of the reaction chamber is heated by the heated nitrogen, performing heat treatment. The amount of time may be predetermined. The temperature of the nitrogen that has reached the exhaust portion is lowered, but it is then circulated and once again heated by the heat generator, and again used to heat the substrate to be processed. A period up through the halogen lamp being turned off is an effective heat treatment period.

After turning off the halogen lamp, nitrogen gas used for cooling is supplied from the gas supply means, and the temperature of the substrate to be processed is lowered. The flow rate of the nitrogen gas used for heating may be maintained constant as is, or it may be lowered. Either way, the halogen lamp is turned off, and therefore the temperature of the nitrogen within the reaction chamber is reduced, and this leads to a reduction in the temperature of the substrate to be processed. The speed of the temperature drop is sudden at first, and then the temperature gradually is reduced. The gate valve is opened when the temperature reaches approximately 200° C. or less, and the substrate to be processed is removed. The supply of the cooling nitrogen may also be stopped at this stage.

This series of processes is taken as one cycle, and a plurality of substrates can be processed in succession by repeating the cycle.

Embodiment 4

Figure 11:
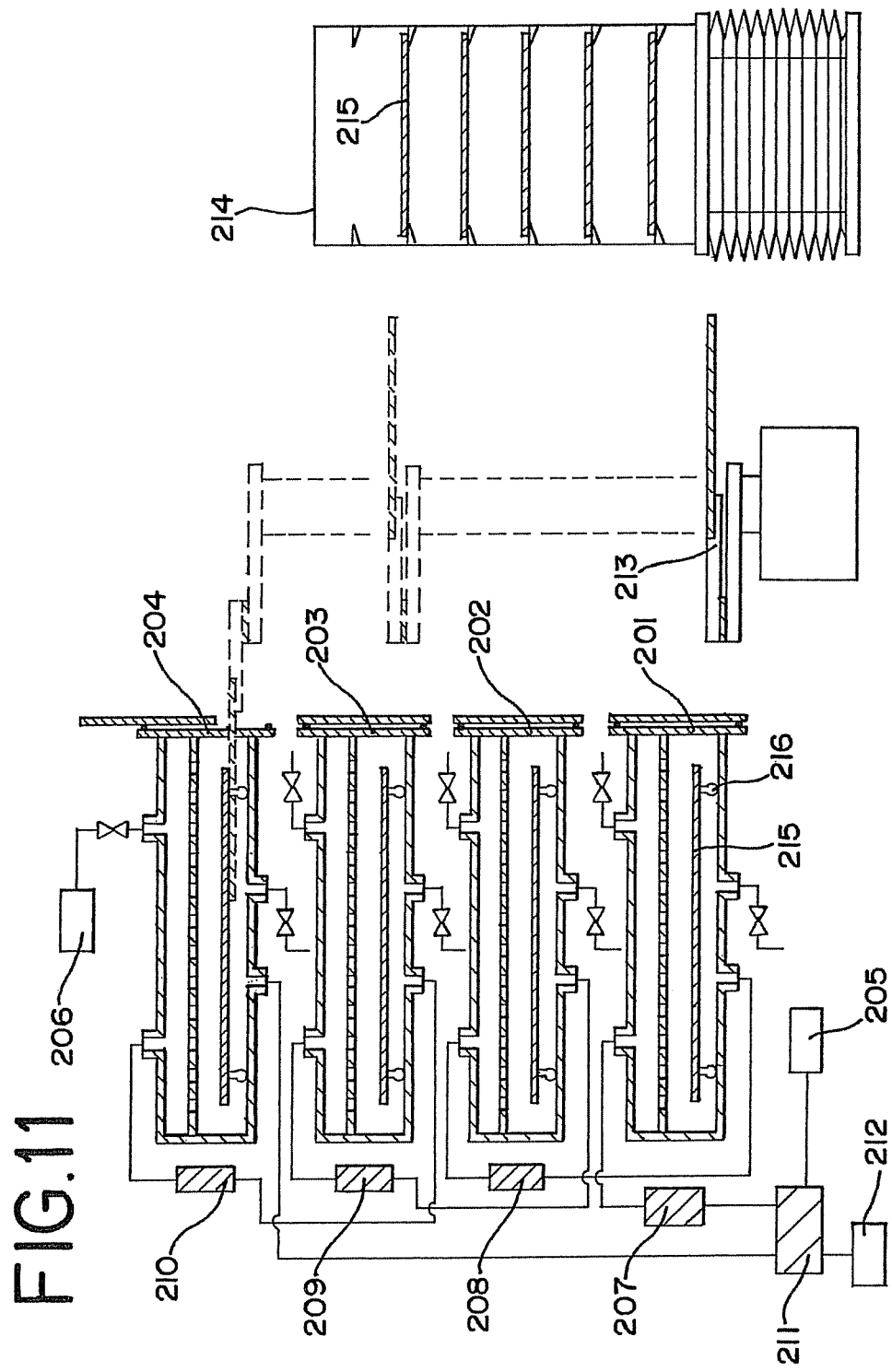
FIG. 11 is a cross sectional structure diagram showing an embodiment of a heat treatment apparatus applying a heat treatment method of the present invention.

FIG. 11 shows an embodiment of a heat treatment apparatus of the present invention. A first gas heat treatment means 207 is formed corresponding to a first processing chamber 201 in FIG. 11. In addition, a second gas heat treatment means 208 is formed corresponding to a second processing chamber 202, a third gas heat treatment means 209 is formed corresponding to a third processing chamber 203, and a fourth gas heat treatment means 210 is formed corresponding to a fourth processing chamber 204. Further, a first gas supply means 205, a second gas supply means 206, a heat exchanger 211, means for curing poisonous gas 212 are formed, and their piping has a structure similar to that of the heat treatment apparatus explained by Embodiment 1.

The first gas supply means 205 supplies a heated gas, and the second gas supply means 206 supplies a cooling gas.

Substrates 215 held in a cassette 214 are conveyed by a conveyor means 213 to each of the processing chambers, and set on holding means 216. The substrates are taken into and removed from the processing chambers by opening and closing gate valves.

FIG. 14 shows a structure of a heat treatment apparatus prepared with a plurality of processing chambers. The structure has processing chambers 501 and 502, first gas supply means 506 and 509, second gas supply means 507 and 510, and gas heat treatment means 508 and 511. The processing chambers 501 and 502 may have a plurality of stages overlapping, and gas treatment means may be located corresponding to the stages. FIG. 11 may be referred to for this type of structure. A buffer cassette 503 holds one edge of a substrate that has been heat treated and is removed from the processing chamber, and the substrate is additionally cooled here. Cassettes 505a to 505c are used when holding and transporting substrates. A conveyor means 504 is used to move the substrates between the cassettes 505a to 505c, the processing chambers 501 and 502, and the buffer cassette 503.

The number of stages in the processing chambers can be determined by the amount of time necessary for heat treatment and by the movement speed of the conveyor means (namely, the speed at which the substrate is capable of being moved). If the tact time is on the order of 10 minutes, then from 3 to 10 stages can be set into the processing chambers 501 and 502.

FIG. 14 shows one example of a heat treatment apparatus structure using a large volume batch processing method, but it is not necessary to place limits on the structure and the configuration, and it is possible to use predetermined configurations. The heat treatment apparatus shown by this embodiment is a batch processing method. This is a method in which substrates to be processed are heated by using a heated gas, and therefore heat treatment processing can be performed with good uniformity even if the substrate size becomes large. For example, this method can also be applied to heat treatment of substrates in which the length of one side exceeds 1000 mm.

The heat treatment method of the present invention, and the heat treatment apparatus using this method, are not constrained by the shape or the size of the substrates to be processed. It is not necessary to use a strengthened susceptor even if the substrates to be processed are made large size due to the sheet processing, and the apparatus can thus be made smaller. Furthermore, it is not necessary to have a large scale heat treatment means, and energy consumption can be economized.

Embodiment 5

An example of using a heat treatment method of the present invention, and a heat treatment apparatus applying the heat treatment method, to perform heat treatment for crystallization of a semiconductor film and for performing gettering is explained using FIGS. 6A to 6F.

Figure 6A:
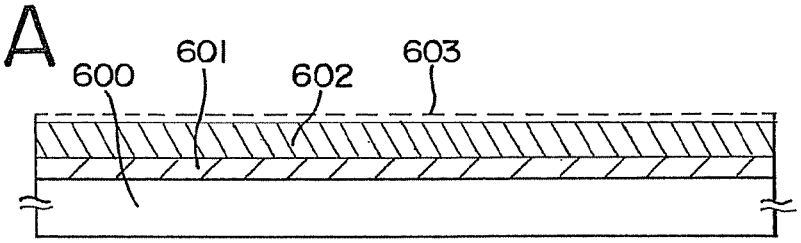
FIGS. 6A to 6F are cross sectional diagrams for explaining a method of manufacturing a semiconductor film by applying a heat treatment method and a heat treatment apparatus of the present invention.

There are no special limitations placed on the material of a substrate 600 in FIG. 6A, but it is preferable to use a material such as barium borosilicate glass, aluminum borosilicate glass, or quartz. An inorganic insulating film is formed to a thickness of 10 to 200 nm on the surface of the substrate 600 as a blocking layer 601. An example of a preferable blocking layer is a silicon oxynitride film manufactured by using plasma CVD. A first silicon oxynitride film manufactured from $SiH_4$, $NH_3$, and $N_2O$, formed having a thickness of 50 nm, and a second silicon oxynitride film manufactured from $SiH_4$ and $N_2O$, formed having a thickness of 100 nm, are applied as the blocking layer 601. The blocking layer 601 is a layer formed so that alkaline metals contained within the glass substrate do not diffuse within semiconductor films formed on the upper layer, and it is possible to omit the blocking layer for cases in which quartz is used as the substrate.

A semiconductor material having silicon as its main constituent is used for a semiconductor film (first semiconductor film) 602 having an amorphous structure formed on the blocking layer 601. Films such as an amorphous silicon film or an amorphous silicon germanium film are typically applied, and formed to a thickness of 10 to 100 nm using plasma CVD, reduced pressure CVD, or sputtering. In order to obtain good crystals, the concentration of impurities such as oxygen and nitrogen contained in the amorphous structure semiconductor film 602 may be reduced to be equal to or less than $5 \times 10^{18}/cm^3$. These impurities become primary factors in obstructing crystallization of the amorphous semiconductor film, and further, are primary factors in increasing the density of capturing centers and recrystallization centers after crystallization. It is therefore preferable a CVD apparatus capable of an ultra high vacuum and prepared with a mirror surface processed (electric field polishing) reaction chamber and an oil free vacuum evacuation system, using material gasses having high purity.

A metallic element having a catalytic action for promoting crystallization is then added to the surface of the amorphous structure semiconductor film 602. One element, or a plurality of elements, selected from the group consisting of iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used as the metallic element having a catalytic action for promoting crystallinity of the semiconductor film. Nickel is typically used, and a nickel acetate salt solution containing from 1 to 100 ppm nickel by weight is applied, by using a spinner, forming a catalyst containing layer 603. The amount of time in which crystallization is performed can be made shorter as the amount of nickel contained becomes greater.

In this case, an extremely thin oxide film is formed by an aqueous solution containing ozone as a surface process for the amorphous structure semiconductor film 602 in order to increase wetting of the solution. After forming a clean surface by etching the oxide film using a solution in which hydrofluoric acid and aqueous hydrogen peroxide are mixed, an extremely thin oxide film is again formed by processing using the ozone containing aqueous solution. The surface of semiconductor films such as silicon has hydrophobic properties, and therefore the nickel acetate salt solution can be applied uniformly if the oxide film is thus formed.

The catalyst containing film 603 is of course not limited to this type of method, and may also be formed by methods such as sputtering, evaporation, and plasma processing. Further, the catalyst containing layer 603 may also be formed before forming the amorphous structure semiconductor film 602, that is the catalyst containing layer 603 may be formed on the blocking layer 601.

Heat treatment is performed for crystallization with the amorphous structure semiconductor film 602 and the catalyst containing layer 603 held in a state of contact. Heat treatment uses a heat treatment apparatus structured as shown by 10. FIG. 15 is a graph for explaining the heat treatment steps, and the heat treatment process steps are explained below while referring to the graph of FIG. 15.

A gas such as nitrogen or argon can be used as a heat treatment gas. The substrate 600 on which the amorphous semiconductor film is formed is set inside the reaction chamber from the cassette by using the conveyor mechanism, and the gate valve is then closed. Nitrogen continues to be supplied from the gas supply means to the inside of the reaction chamber during this period, in consideration of minimizing the mixing in of the external atmosphere. After closing the gate valve, the flow rate of nitrogen is increased, and the inside of the reaction chamber is replaced and filled by nitrogen.

The flow rate of nitrogen is then increased, and the nitrogen gas supplied from the gas heat treatment means is heated to a first temperature. The heating temperature can be regulated by the electric power supplied to the heat generator, or by the amount of electric power supplied and by the amount of nitrogen supplied. The substrate is heated here with the first temperature set to 550±50° C. (A-1: a first stage of temperature increase shown by FIG. 15). The amount of time required for this temperature increase is 2 minutes.

After the substrate has reacted the first temperature, it is held in that state for 3 minutes. At this stage, crystal nuclei are formed in the amorphous semiconductor film (A-2: a nuclei formation stage shown by FIG. 15). Next, heating to a second temperature is performed for crystallization. The nitrogen gas used for heating is increased in temperature to 675±25° C., and the substrate is heated (A-3: a second stage of temperature increase shown by FIG. 15). The substrate is held as is for 5 minutes after the second temperature is reached, performing crystallization (A-4: a crystallization stage shown by FIG. 15). The nitrogen gas used for heating of course continues to be supplied during the period up through this point.

After a predetermined amount of time has passed, the supply of the nitrogen gas used for heating is stopped, and the nitrogen gas used for cooling is supplied. The nitrogen gas approximately at room temperature may be used. The substrate cools rapidly by doing so (B-1: a stage of temperature decrease shown by FIG. 15). The time for this stage is approximately 3 minutes. Once the substrate has cooled to a temperature on the order of 300° C., it is removed from the processing chamber by using the conveyor means, and is transferred to the buffer cassette. The substrate is additionally cooled to a temperature equal to or less than 150° C. here (B-2: transfer stage shown by FIG. 15). Next, the heat treatment for crystallization is completed by transferring the substrate to the cassette.

The time between placing the substrate into the heat treatment apparatus and starting heat treatment, until the substrate is removed, is 13 minutes. Heat treatment for crystallization can thus be performed in a very short amount of time by using the heat treatment apparatus and the heat treatment method of the present invention.

Figure 6B:
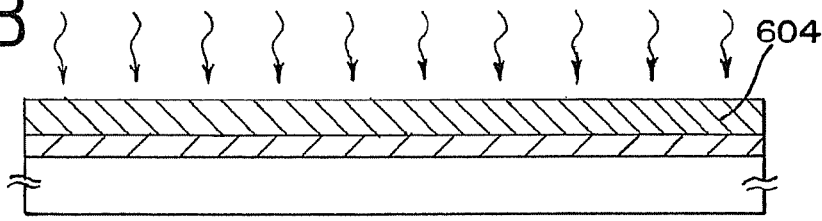

A semiconductor film (first semiconductor film) 604 having a crystal structure can thus be obtained as shown in FIG. 6B.

Figure 6C:
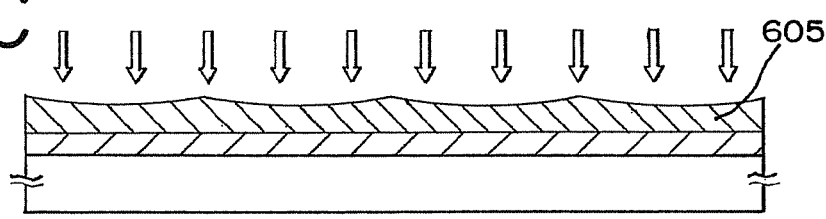

In addition, it is effective to irradiate laser light to the crystalline structure semiconductor film 604 as shown in FIG. 6C in order to increase crystallinity (the ratio of crystal element to the total volume of the film) and in order to repair defects within crystal grains. Excimer laser light having a wavelength equal to or less than 400 nm, or the second harmonic or the third harmonic of a YAG laser is used as the laser. Whichever is employed, pulse laser light having a repetition frequency on the order of 10 to 1000 Hz is used, the laser light is condensed by an optical system to between 100 and 400 mJ/cm$^2$, and laser processing may be performed with respect to the crystalline structure semiconductor film 604 by using an overlap ratio of 90 to 95%.

The catalytic element (nickel here) remains in a crystalline structure semiconductor film (first semiconductor film) 605 thus obtained. Even if the catalytic element is not distributed uniformly, on average, a concentration exceeding $1 \times 10^{19}/cm^3$ remains within the film. It is of course possible to form all types of semiconductor elements, such as TFTs, with the semiconductor film in this state, but the element is removed here by gettering using the method shown below.

Figure 6D:
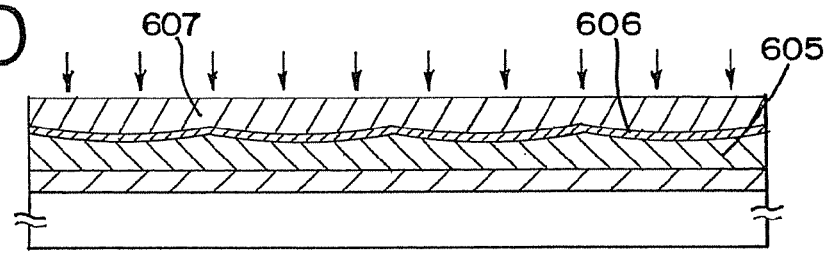
Figure 6E:
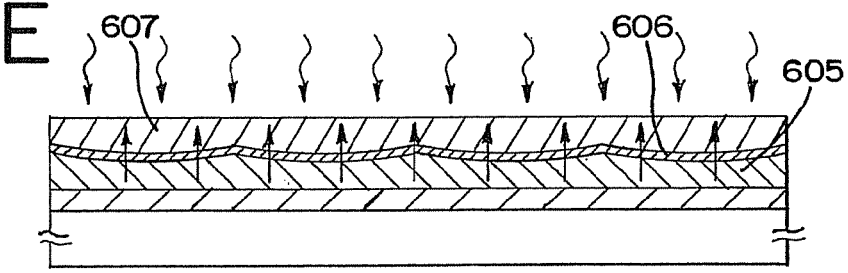

First, a thin barrier layer 606 is formed on the surface of the crystalline structure semiconductor film 605 as shown in FIG. 6D. There are no particular limitations placed on the thickness of the barrier layer, but for simplicity, a chemical oxide formed by processing with aqueous ozone may also be used. Further, a chemical oxide can also be formed similarly by processing using an aqueous solution in which an acid such as sulfuric acid, hydrochloric acid, or nitric acid is mixed with aqueous hydrogen peroxide. Plasma processing within an oxidizing atmosphere, and oxidation processing in which ozone is generated by ultraviolet light irradiation within an oxygen containing atmosphere may also be used as other methods. Further, a thin oxide film formed by heating the substrate to a temperature on the order of 200 to 350° C. using a clean room may also be used as the barrier layer. Alternatively, an oxide film having a thickness on the order of 1 to 5 nm may be formed by a method such as plasma CVD, sputtering, or evaporation and used as the barrier layer.

A semiconductor film (second semiconductor film) 607 is then formed having a thickness of 25 to 250 nm on the barrier layer by using plasma CVD or sputtering. An amorphous silicon film is typically selected. The semiconductor film 607 is later removed, and therefore it is preferable to form a film having a low density in order to increase the etching selectivity with respect to the crystalline structure semiconductor film 605. For example, the substrate temperature may be set to on the order of 100 to 200° C. and hydrogen may be included within the film at a concentration of 25 to 40 atom %, for cases in which the amorphous silicon film is formed by plasma CVD. The case of employing sputtering is similar, and a large amount of hydrogen can be included within the film by sputtering at a substrate temperature equal to or less than 200° C. and using a gas mixture of argon and hydrogen. Furthermore, if a rare gas element is added during film formation by sputtering or plasma CVD, then the rare gas element can also be similarly contained within the film. Gettering sites can be formed by the rare gas elements thus taken in.

Next, a rare gas element is added to the semiconductor film 607 by using ion doping or ion injection so as to be contained at a concentration of $1 \times 10^{20}$ to $2.5 \times 10^{22}/cm^3$. The acceleration voltage may be predetermined. Rare gas ions are injected, and therefore it is not a problem if a portion of the rare gas ions pass through the semiconductor film 607 and the barrier layer 606, and reach the crystalline structure semiconductor film 605. The rare gas elements themselves are inactive within the semiconductor film, and therefore even if regions in the vicinity of the semiconductor film 605 surface contain the rare gas at a concentration on the order of $1 \times 10^{13}$ to $1 \times 10^{20}/cm^3$, there will be almost no influence on the semiconductor element characteristics. Further, rare gas elements may also be added at the stage where the semiconductor film 607 is formed.

One element, or a plurality of elements, selected from the group consisting of helium (He), neon (Ne), argon (Ar), krypton (Kr), and xenon (Xe) is used as the rare gas element. The rare gas elements are used as ion sources in order to form gettering sites with the present invention, and are injected into the semiconductor film by ion doping or ion injection. There are two meanings associated with injecting ions of the rare gas elements. One is that dangling bonds are formed by injecting, imparting distortions to the semiconductor film. The other is that distortions are formed within the semiconductor film lattice by injecting the ions. Injection of the inert gas ions can fulfill both or these meanings at the same time, and in particular, the latter can be obtained remarkably if an element having an atomic radius greater than that of silicon is used, such as argon (Ar), krypton (Kr), or xenon (Xe).

In order to achieve gettering with certainty, later heat treatment becomes necessary. FIG. 16 is a graph for explaining heat treatment process steps, and the heat treatment process is explained below while referring to the graph. A heat treatment apparatus of the present invention is similarly used for the heat treatment process. Further, it is preferable to use the an apparatus having a structure as shown in FIG. 14 in order to process a plurality of substrates with good efficiency. Gasses such as nitrogen and argon can be used as the heating gas.

Gasses such as nitrogen and argon can be used as the heating gas. The substrate 600 on which the structure of FIG. 6D is formed is set inside of the reaction chamber from the cassette by the conveyor means, and the gate valve is then closed. Nitrogen continues to be supplied from the gas supply means to the inside of the reaction chamber during this period, in consideration of minimizing the mixing in of the external atmosphere. After closing the gate valve, the flow rate of nitrogen is increased, and the inside of the reaction chamber is replaced and filled by nitrogen.

The flow rate of nitrogen is then increased, and the nitrogen gas supplied from the gas heat treatment means is heated to a third temperature. The heating temperature can be regulated by the electric power supplied to the heat generator, or by the amount of electric power supplied and by the amount of nitrogen supplied. The substrate is heated here with the third temperature set to 675±25° C. (a stage of temperature increase shown by FIG. 16). The amount of time required for this temperature increase is 2 minutes.

After the substrate has reacted the third temperature, it is held in that state for 3 minutes. Gettering thus occurs (a gettering stage shown in FIG. 16). The catalytic element in regions to be gettered (capture sites) is released by thermal energy, and moves to gettering sites by diffusion. Gettering is therefore dependant on the processing temperature, and gettering advances in a shorter amount of time the higher the temperature is. The movement direction of the catalytic elements is a distance on the order of the thickness of the semiconductor film, as shown by the arrows in FIG. 6E, and gettering can be accomplished in a relatively short amount of time.

After a predetermined amount of time has passed, the supply of the nitrogen gas used for heating is stopped, and the nitrogen gas used for cooling is supplied. The nitrogen gas approximately at room temperature may be used. The substrate cools rapidly by doing so (a stage of temperature decrease shown by FIG. 16). The time for this stage is approximately 3 minutes. Once the substrate has cooled to a temperature on the order of 300° C., it is removed from the processing chamber by using the conveyor means, and is transferred to the buffer cassette. The substrate is additionally cooled to a temperature equal to or less than 150° C. here (transfer stage shown by FIG. 16). Next, the heat treatment for gettering is completed by transferring the substrate to the cassette.

The time between placing the substrate into the heat treatment apparatus and starting heat treatment, until the substrate is removed, is 9 minutes. Heat treatment for gettering can thus be performed in a very short amount of time by using the heat treatment apparatus and the heat treatment method of the present invention.

Note that the semiconductor film 607 containing the rare gas at a concentration equal to or greater than $1 \times 10^{20}/cm^3$ is not crystallized by this heat treatment process. It is considered that this is because the rare gas elements remain within the film, without being re-emitted, at the heat treatment temperature range, thus inhibiting crystallization of the semiconductor film.

The amorphous semiconductor film 607 is next removed by selectively etching. The etching method can be performed by dry etching using a $ClF_3$ plasma, or by using an aqueous solution containing hydrating or tetraethyl ammonium hydroxide (chemical formula $(CH_3)_4NOH$) at a concentration of 20 to 30%, preferably 25%, and heating to a temperature of 50° C., easily removing the semiconductor film. The barrier layer 606 becomes an etching stopper at this time, and remains almost without being etched at all the barrier layer 606 may be later removed using hydrofluoric acid.

Figure 6F:
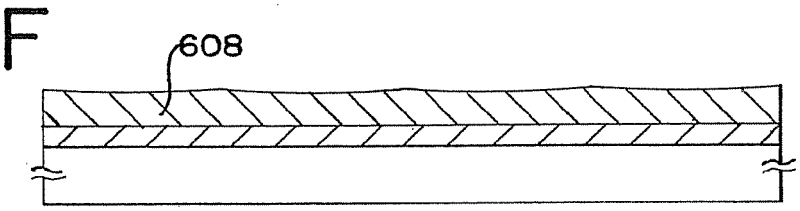

A semiconductor film 608 having a crystalline structure in which the concentration of the catalytic element is reduced to be equal to or less than $1\times10^{17}/cm^3$ can thus be obtained as shown in FIG. 6F. The crystalline structure semiconductor film 608 thus formed is formed having thin rod shape or thin flat rod shape crystals due to the action of the catalyst element, and each of the crystals grows having a specific directionality when seen macroscopically. The crystalline structure semiconductor film 608 can be applied not only to active layers of TFTs, but also to the photoelectric conversion layers of photo sensors and solar batteries.

Embodiment 6

A method of manufacturing a TFT using a semiconductor film manufactured by Embodiment 5 is explained using FIGS. 7A to 7F. The heat treatment method and the heat treatment apparatus of the present invention can also be used in the method of manufacturing a TFT explained in this embodiment.

Figure 7A:
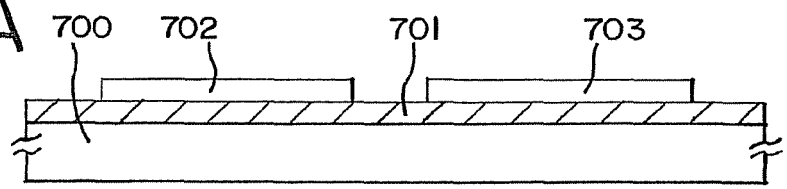
FIG. 7A to 7F are cross sectional diagrams for explaining a method of manufacturing a TFT by applying a heat treatment method and a heat treatment apparatus of the present invention.

First, semiconductor films 702 and 703 separated into island shapes are formed in FIG. 7A on a transparent substrate 700, such as aluminum borosilicate glass or barium borosilicate glass, from a semiconductor film manufactured by using Embodiment 4. Further, a first insulating film 701 is formed having a thickness of 50 to 200 nm between the substrate 700 and the semiconductor film. The first insulating film is formed from one material, or a mixture of a plurality of materials, selected from the group consisting of silicon nitride, silicon oxide, and silicon oxynitride.

Figure 7B:
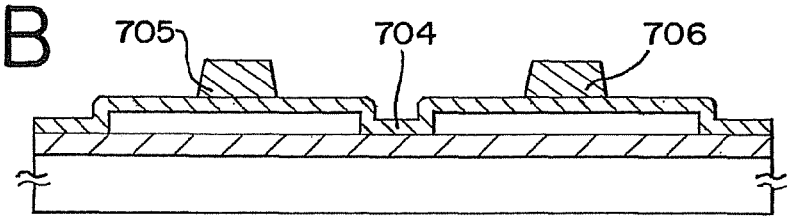

A second insulating film 704 is formed next with a thickness of 80 nm, as shown in FIG. 7B. The second insulating film 704 is utilized as a gate insulating film, and is formed using plasma CVD or sputtering. It becomes possible to reduce the fixed charge density of a silicon oxynitride film manufactured by adding $SiH_4$, $N_2O$, and $O_2$ as the second insulating film 704 and therefore this is a material that is preferable for use as the gate insulating film. The gate insulating film is of course not limited to this type of silicon oxynitride film, and insulating films such as silicon is oxide films and tantalum oxide films may also be used in single layer or laminate structures.

A first conductive film is formed in order to form a gate electrode on the second insulating film 704. There are no limitation placed on the first conductive film material, and conductive materials such as aluminum, tantalum, titanium, tungsten, and molybdenum, and alloys of these materials, can be applied. A laminate structure of tantalum nitride or titanium nitride with tungsten or a molybdenum tungsten alloy, a laminate structure of tungsten and aluminum or copper, and the like can be employed as the structure of a gate electrode that uses this type of material. If aluminum is used, then aluminum to which from 0.1 to 7 weight % of an element such as titanium, scandium, neodymium, silicon, or copper is added is employed in order to increase its heat resistance. The first conductive film is formed to a thickness of 300 nm.

A resist pattern is formed next, and gate electrodes 705 and 706 are formed. Further, although not shown in the figures, wirings connected to the gate electrodes can also be formed simultaneously.

Figure 7C:
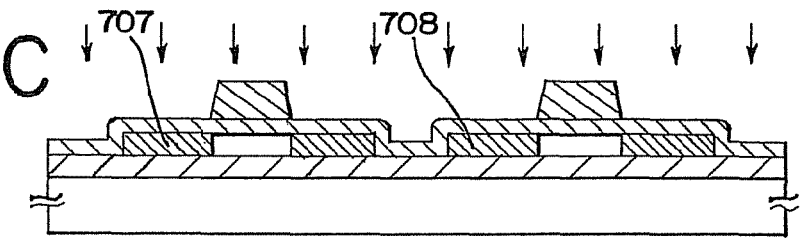
Figure 7D:
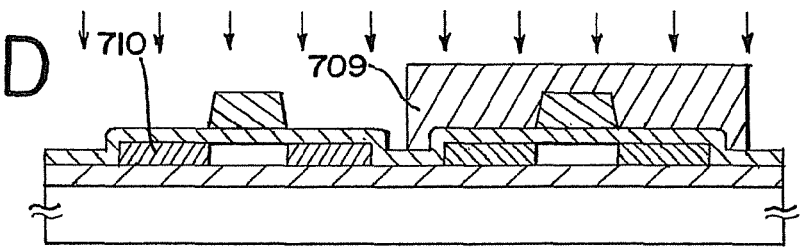

N-type semiconductor regions 707 and 708 are then formed in a self aligning manner with the gate electrodes used as masks, as shown in FIG. 7C. Phosphorous is injected using ion injection or ion doping (referring here to a method in which ions are injected without separation of mass) as a doping method. Doping is performed so that the phosphorous concentration of this region is set so as to become with a range of $1\times10^{20}$ to $1\times10^{21}/cm^3$.

A mask 709 is then formed covering one semiconductor film, the semiconductor film 703, and a p-type semiconductor region 710 is formed in the semiconductor film 702. Boron is used as the impurity added, and in order to invert n-type conductivity, boron is added at a concentration that is from 1.5 to 3 times that of phosphorous. The boron concentration of this region is set so as to become with a range of $1.5\times10^{20}$ to $3\times10^{21}/cm^3$.

Figure 7E:
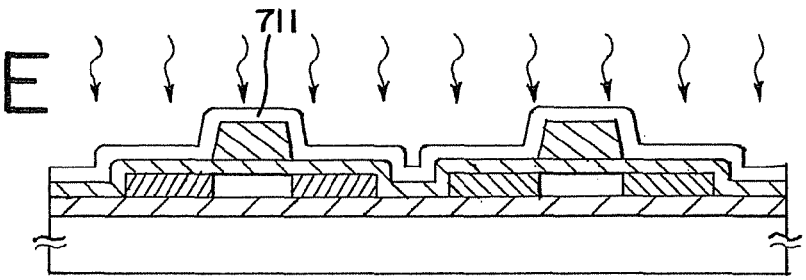

Next, as shown in FIG. 7E, a third insulating film 711 made from a silicon oxynitride film or a silicon nitride film is formed with a thickness of 50 nm by CVD.

The heat treatment is then performed in order to restore the crystallinity of the n-type and p-type semiconductor film regions, and in order to perform activation. A heat treatment apparatus having the structure shown by FIG. 1 is used for heat treatment, which can be performed by the procedure shown by Embodiment 3. Further, the apparatuses of FIG. 3 and FIG. 4 may also be used in order to process a plurality of substrates with good efficiency, and an apparatus having the structure of FIG. 10 or FIG. 11 may also be used.

Gasses such as nitrogen and argon can be used as the heating gas. Activation is performed by heating the gas to between 450 and 700° C., and performing heat treatment for 10 to 3600 seconds. Further, a reducing atmosphere in which hydrogen is added to the gas may also be used. Hydrogenation can be performed at the same time by the addition of hydrogen.

If heat treatment is performed by RTA with respect to a state in which gate electrodes are formed on a glass substrate, the gate electrodes selectively absorb lamp light radiation, there is localized heating, and there are times in which the glass substrate is damaged. Heat treatment in accordance with the present invention is heating by use of a gas, and therefore there is no similar influence imparted.

Figure 7F:
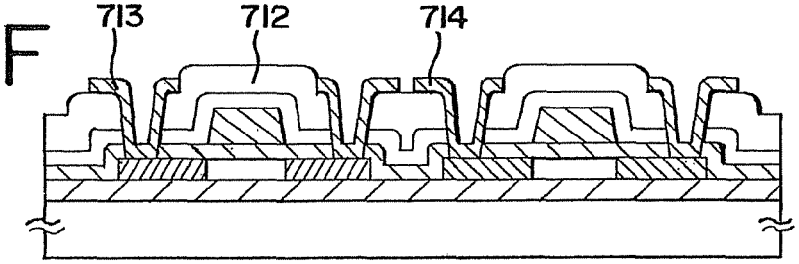

A fourth insulating film 712 shown in FIG. 7F is formed by a silicon oxide film or a silicon oxynitride film. Alternatively, an organic insulating material such as polyimide or acrylic may be formed, and its surface may be leveled.

Next, contact holes are formed in order to reach the impurity regions of each semiconductor film from the surface of the fourth insulating film 712, and wirings are formed using a material such as Al, Ti, or Ta. Reference numerals 713 and 714 in FIG. 7F denote source wirings or drain electrodes. An n-channel TFT and a p-channel TFT can thus be formed. Although the TFTs are shown as simple elements here, CMOS circuits, NMOS circuits, and PMOS circuits can be formed using the TFTs.

Embodiment 7

It is possible to form an oxide film on the surface of a semiconductor by mixing an inert gas for heating with a gas selected from the group consisting of oxygen, nitrous oxide, and nitrogen dioxide, and using this as an oxidizing gas in a heat treatment method, and a heat treatment apparatus applying the heat treatment method, of the present invention.

Figure 9A:
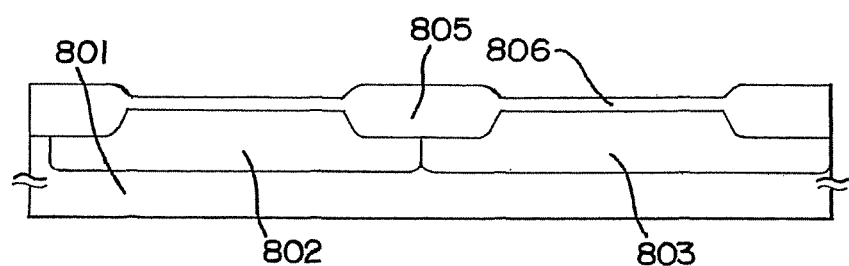
FIGS. 9A to 9C are cross sectional diagrams for explaining a process of heat treating a semiconductor substrate by applying a heat treatment method and a heat treatment apparatus of the present invention.
Figure 9B:
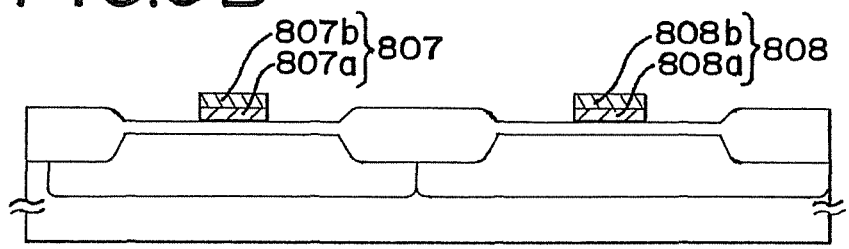
Figure 9C:
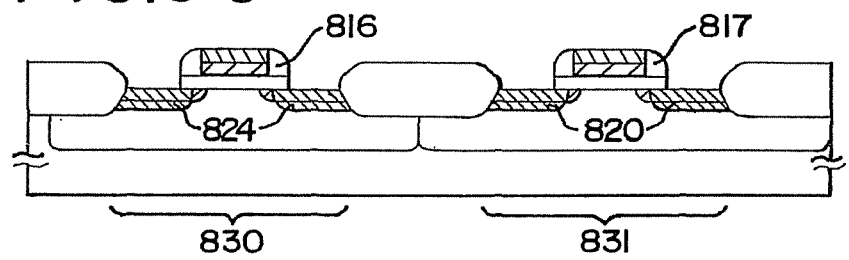

FIGS. 9A to 9C show such an example, and between 1 and 30% of oxygen is mixed with nitrogen used as a heating gas. By performing heat treatment at a temperature of 850 to 1000° C., a field oxide film for element separation, and a gate insulating film can be formed on a single crystal silicon substrate.

An n-well 802 and a p-well 803 are formed in a substrate 801 made from single crystal silicon having a relatively high resistance (for example, n-type, on the order of 10 Ωcm).

Next, a field oxide film 805 is formed using the heat treatment method of the present invention and using a mixed gas of oxygen and nitrogen as a heating gas. Boron (B) may be introduced into the semiconductor substrate by selective ion injection of boron at this point, forming a channel stopper. The heat treatment temperature is set from 800 to 1000° C.

Formation of a silicon oxide film 806 that becomes a gate insulating film is then similarly performed. An apparatus having the structure shown by FIG. 1, FIG. 3, or FIG. 4 may be used as the apparatus employed in forming the field oxide film 805 and the silicon oxide film 806.

Next, as shown by FIG. 9B, a polycrystalline silicon film used for gates is formed having a thickness of 100 to 300 nm using CVD. The polycrystalline silicon film used for gates may be doped in advance by phosphorous (P) having a concentration on the order of $10^{21}/cm^3$ in order to lower its resistance, and a strong n-type impurity may also be diffused after forming the polycrystalline silicon film. A silicide film is formed having a thickness of 50 to 300 nm here on this polycrystalline silicon film in order to additionally lower the resistance. It is possible to apply materials such as molybdenum silicide (MoSix), tungsten silicide (WSix), tantalum silicide (TaSix), and titanium silicide (TiSix) as the silicide material, and the film may be formed in accordance with a known method. The polycrystalline silicon film and the silicide film are then etched, forming gates 807 and 808. The gates 807 and 808 have a two layer structure from polycrystalline silicon films 807a and 808a, and silicide films 807b and 808b, respectively.

Source and drain regions 820 of an n-channel MOS transistor, and source and drain regions 824 of a p-channel MOS transistor are then formed as shown in FIG. 9C by ion injection. The heat treatment method and the heat treatment apparatus of the present invention can of course be used in order to perform recrystallization and activation of these source and drain regions. The heat treatment temperature is set from 700 to 1000° C., preferably so as to become 950° C. and heat treatment is performed by a heat treatment means and employing the gas used for heating. Impurities can be activated, and the source and drain regions can be made lower resistance by this heat treatment process.

An n-channel MOS transistor 331 and a p-channel MOS transistor 330 can thus be completed. The structure of the transistors explained in this embodiment is only one example, and it is not necessary to place limitations on the manufacturing processes and the structures shown in FIGS. 9A to 9C. CMOS circuits, NMOS circuits, and PMOS circuits can be formed using these transistors. Further, it is possible to form various types of circuits, such as shift registers, buffers, sampling circuits, D/A converters, and latches by using the transistors, and semiconductor devices such as memories. CPUs, gate arrays, and RISC processors can be manufactured. High speed operation is possible for these circuits due to the MOS structure, and further, they can be made to have lower electric power consumption by using a driver voltage from 3 to 5 V.

As explained above, heat treatment of a substrate to be processed can be performed without being constrained by the shape or the size of the substrates to be processed. It is not necessary to use a strengthened susceptor even if the substrates to be processed are made large size, and the apparatus can thus be made smaller. The heat treatment method of the present invention, and the heat treatment apparatus using the heat treatment method, use a batch processing method. This is a method in which substrates to be processed are heated by using a heated gas, and therefore heat treatment processing can be performed with good uniformity even if the substrate size becomes large. For example, this method can also be applied to heat treatment of substrates in which the length of one side exceeds 1000 mm. A heat treatment apparatus capable of using less electrical energy can therefore be achieved without the need for a large scale heat treatment means.

Heat treatment of substrates to be processed can be used to perform crystallization of amorphous semiconductor films, gettering, activation of impurities, hydrogenation, oxidation of semiconductor surfaces, and the like. Integrated circuits having a large surface area substrate can be formed by incorporating this type of process into a semiconductor element manufacturing process.

What is claimed is:

1. A heat treatment apparatus comprising:
a reaction chamber comprising an intake portion and an exhaust portion;
a first portion configured to supply a gas to the intake portion;
a second portion configured to heat the gas supplied from the intake portion and for supplying the heated gas to a substrate;
a third portion configured to hold the substrate which is to be heated by the heated gas;
a connecting pipe connected to the intake portion and the exhaust portion: and
an orifice plate between the second portion and the third portion,
wherein the orifice plate comprising pores,
wherein the second portion comprises a lamp and a heat absorber covering the lamp, the second portion is positioned in the reaction chamber,
wherein the heat absorber includes fins, the fins are positioned to contact with the gas,
wherein the second portion and the third portion are separated by the orifice plate, and
wherein the heated gas is supplied to the third portion from the second portion through the pores.

2. The heat treatment apparatus according to claim 1, wherein the lamp is selected from the group consisting of a halogen lamp, a metal halide lamp, a high pressure mercury lamp, a high pressure sodium lamp, and a xenon lamp.

3. The heat treatment apparatus according to claim 1, wherein the gas is selected from nitrogen and rare gases.

4. The heat treatment apparatus according to claim 1, wherein the gas is one of reducing gases.

5. The heat treatment apparatus according to claim 1, wherein the gas is one of oxidizing gases.

6. The heat treatment apparatus according to claim 1, wherein the heat absorber comprises quartz, SiC, or Si.

7. The heat treatment apparatus according to claim 4, wherein the reducing gas is hydrogen.

8. The heat treatment apparatus according to claim 5, wherein the oxidizing gas is selected from oxygen, nitrous oxide, and nitrogen dioxide.

* * * * *